(12) United States Patent
Inada et al.

(10) Patent No.: US 10,115,874 B2
(45) Date of Patent: Oct. 30, 2018

(54) LIGHT-EMITTING DEVICE INCLUDING PHOTOLUMINESCENT LAYER

(71) Applicant: Panasonic Intellectual Property Management Co., Ltd., Osaka (JP)

(72) Inventors: Yasuhisa Inada, Osaka (JP); Taku Hirasawa, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 245 days.

(21) Appl. No.: 15/166,123

(22) Filed: May 26, 2016

(65) Prior Publication Data

US 2016/0359085 A1      Dec. 8, 2016

(30) Foreign Application Priority Data

Jun. 8, 2015 (JP) ................................. 2015-115795

(51) Int. Cl.
    *H01L 33/50*       (2010.01)
    *H01L 33/44*       (2010.01)

(52) U.S. Cl.
    CPC ............ *H01L 33/508* (2013.01); *H01L 33/44* (2013.01)

(58) Field of Classification Search
    CPC .............................. H01L 33/504; H01L 33/44
    (Continued)

(56) References Cited

U.S. PATENT DOCUMENTS

| 5,517,039 A | 5/1996 | Holonyak, Jr. et al. |
| 5,732,102 A | 3/1998 | Bouadma |

(Continued)

FOREIGN PATENT DOCUMENTS

| JP | 9-073807 | 3/1997 |
| JP | 11-283751 | 10/1999 |

(Continued)

OTHER PUBLICATIONS

The Extended European Search Report dated Dec. 16, 2016 for the related European Patent Application No. 14883764.4.

(Continued)

*Primary Examiner* — Laura Tso
(74) *Attorney, Agent, or Firm* — McDermott Will & Emery LLP

(57) ABSTRACT

A light-emitting device comprises a photoluminescent layer that emits light including first light in an infrared region; and a light-transmissive layer located on the photoluminescent layer. At least one of the photoluminescent layer and the light-transmissive layer has a periodic structure having projections or recesses or both arranged perpendicular to the thickness direction of the photoluminescent layer. At least one of the photoluminescent layer and the light-transmissive layer has a light emitting surface perpendicular to the thickness direction of the photoluminescent layer, the first light being emitted from the light emitting surface. A refractive index $n_{wav-a}$ of the photoluminescent layer for the first light and a period $p_a$ of the periodic structure satisfy $\lambda_a/n_{wav-a} < p_a < \lambda_a$. A thickness of the photoluminescent layer, the refractive index $n_{wav-a}$ and the period $p_a$ are set to limit a directional angle of the first light emitted from the light emitting surface.

17 Claims, 20 Drawing Sheets

(58) Field of Classification Search
USPC .......................................................... 362/84
See application file for complete search history.

(56) References Cited

U.S. PATENT DOCUMENTS

| | | | |
|---|---|---|---|
| 6,728,034 | B1 | 4/2004 | Nakanishi et al. |
| 7,619,357 | B2 | 11/2009 | Onishi et al. |
| 7,699,482 | B2 | 4/2010 | Noguchi |
| 8,227,966 | B2 | 7/2012 | Wakabayashi et al. |
| 8,619,363 | B1 | 12/2013 | Coleman |
| 9,158,215 | B2 * | 10/2015 | Yu .................... G03G 7/0053 |
| 9,515,239 | B2 | 12/2016 | Inada et al. |
| 9,618,697 | B2 | 4/2017 | Inada et al. |
| 2002/0180348 | A1 | 12/2002 | Oda et al. |
| 2003/0021314 | A1 | 1/2003 | Yoshida et al. |
| 2003/0169792 | A1 | 9/2003 | Kim |
| 2004/0141108 | A1 | 7/2004 | Tanaka et al. |
| 2004/0233534 | A1 | 11/2004 | Nakanishi et al. |
| 2006/0039433 | A1 | 2/2006 | Simpson |
| 2006/0088066 | A1 | 4/2006 | He |
| 2007/0031097 | A1 | 2/2007 | Heikenfeld et al. |
| 2007/0103931 | A1 | 5/2007 | Lee et al. |
| 2007/0138479 | A1 | 6/2007 | Yamazaki et al. |
| 2007/0153860 | A1 | 7/2007 | Chang-Hasnain et al. |
| 2008/0069497 | A1 | 3/2008 | Tissot et al. |
| 2008/0089089 | A1 | 4/2008 | Hama et al. |
| 2008/0149916 | A1 | 6/2008 | Baba et al. |
| 2008/0258160 | A1 | 10/2008 | Do |
| 2008/0303419 | A1 | 12/2008 | Fukuda |
| 2009/0021153 | A1 | 1/2009 | Lee et al. |
| 2009/0040598 | A1 | 2/2009 | Ito |
| 2009/0040745 | A1 | 2/2009 | Nemchuk |
| 2009/0066241 | A1 | 3/2009 | Yokoyama |
| 2009/0129115 | A1 | 5/2009 | Fine et al. |
| 2009/0190068 | A1 | 7/2009 | Kawamura |
| 2009/0206325 | A1 | 8/2009 | Biwa et al. |
| 2009/0267092 | A1 | 10/2009 | Fukshima et al. |
| 2009/0286337 | A1 | 11/2009 | Lee et al. |
| 2010/0074284 | A1 | 3/2010 | Aizawa et al. |
| 2010/0142189 | A1 | 6/2010 | Hong et al. |
| 2010/0164365 | A1 | 7/2010 | Yoshino et al. |
| 2010/0246210 | A1 | 9/2010 | Yashiro |
| 2010/0277887 | A1 | 11/2010 | Su et al. |
| 2011/0101359 | A1 | 5/2011 | Kim et al. |
| 2011/0198563 | A1 | 8/2011 | Kim et al. |
| 2011/0198645 | A1 | 8/2011 | Jo et al. |
| 2012/0018705 | A1 | 1/2012 | Takazoe et al. |
| 2012/0106127 | A1 | 5/2012 | Hattori et al. |
| 2012/0119638 | A1 | 5/2012 | Sato et al. |
| 2012/0176766 | A1 | 7/2012 | Natsumeda |
| 2012/0224378 | A1 | 9/2012 | Koike et al. |
| 2012/0286258 | A1 | 11/2012 | Naraoka et al. |
| 2012/0292652 | A1 | 11/2012 | Yamae et al. |
| 2013/0069046 | A1 | 3/2013 | Ishizuya |
| 2013/0181195 | A1 | 7/2013 | Cho et al. |
| 2013/0208327 | A1 | 8/2013 | Bolle et al. |
| 2013/0277703 | A1 | 10/2013 | Matsuzaki |
| 2013/0308102 | A1 | 11/2013 | Natsumeda et al. |
| 2014/0022818 | A1 | 1/2014 | Natsumeda et al. |
| 2014/0071683 | A1 | 3/2014 | Hamada et al. |
| 2014/0092620 | A1 | 4/2014 | Tissot |
| 2014/0185316 | A1 | 7/2014 | Kim et al. |
| 2014/0306176 | A1 | 10/2014 | Chiu et al. |
| 2014/0362604 | A1 | 12/2014 | Masuda |
| 2015/0249183 | A1 | 9/2015 | Hirasawa et al. |
| 2015/0249186 | A1 | 9/2015 | Inada et al. |
| 2015/0249187 | A1 | 9/2015 | Inada et al. |
| 2015/0252964 | A1 | 9/2015 | Takahashi et al. |
| 2016/0265746 | A1 | 9/2016 | Hirasawa et al. |
| 2016/0265747 | A1 | 9/2016 | Nagao et al. |
| 2016/0265749 | A1 | 9/2016 | Inada |
| 2017/0012232 | A1 | 1/2017 | Kataishi et al. |
| 2017/0075169 | A1 | 3/2017 | Hayama |

FOREIGN PATENT DOCUMENTS

| | | |
|---|---|---|
| JP | 2001-059905 | 3/2001 |
| JP | 2001-155520 | 6/2001 |
| JP | 2007-103901 | 4/2007 |
| JP | 2007-240641 | 9/2007 |
| JP | 2008-130279 | 6/2008 |
| JP | 2008-521211 | 6/2008 |
| JP | 2008-227458 | 9/2008 |
| JP | 2009-140894 | 6/2009 |
| JP | 2010-015874 | 1/2010 |
| JP | 2010-033772 | 2/2010 |
| JP | 2010-097178 A | 4/2010 |
| JP | 2010-199357 | 9/2010 |
| JP | 2010-210824 | 9/2010 |
| JP | 2010-231941 | 10/2010 |
| JP | 2010-237311 A | 10/2010 |
| JP | 2011-166148 | 8/2011 |
| JP | 2012-093454 | 5/2012 |
| JP | 2012-109334 | 6/2012 |
| JP | 2012-109400 | 6/2012 |
| JP | 2012-182376 | 9/2012 |
| JP | 2013-183020 | 9/2013 |
| JP | 2014-075584 | 4/2014 |
| JP | 2014-082401 | 5/2014 |
| JP | 2014-092645 | 5/2014 |
| JP | 2014-523603 | 9/2014 |
| WO | 2007/034827 | 3/2007 |
| WO | 2007/091687 | 8/2007 |
| WO | 2009/005311 | 1/2009 |
| WO | 2009/099211 | 8/2009 |
| WO | 2011/040528 | 4/2011 |
| WO | 2012/049905 | 4/2012 |
| WO | 2012/108384 | 8/2012 |
| WO | 2012/137584 | 10/2012 |
| WO | 2013/084442 | 6/2013 |
| WO | 2013/125567 | 8/2013 |
| WO | 2013/172025 | 11/2013 |
| WO | 2014/024218 | 2/2014 |
| WO | 2014/119783 | 8/2014 |
| WO | 2015/045886 | 4/2015 |

OTHER PUBLICATIONS

Non-Final Office Action issued in U.S. Appl. No. 15/060,574, dated Jan. 16, 2018.
Final Office Action issued in U.S. Appl. No. 15/214,803, dated Feb. 5, 2018.
Non-final Office Action issued in U.S. Appl. No. 14/618,591, dated Nov. 9, 2015.
Final Office Action issued in U.S. Appl. No. 14/618,591, dated May 19, 2016.
Non-final Office Action issued in U.S. Appl. No. 14/618,254, dated Feb. 3, 2016.
Non-Final Office Action issued in U.S. Appl. No. 14/621,729, dated Mar. 9, 2016.
Final Office Action issued in U.S. Appl. No. 14/621,729, dated Sep. 28, 2016.
International Search Report of PCT application No. PCT/JP2015/000810 dated Apr. 7, 2015.
International Search Report of PCT application No. PCT/JP2015/000811 dated Apr. 7, 2015.
International Search Report of PCT application No. PCT/JP2015/000812 dated Apr. 7, 2015.
International Search Report of PCT application No. PCT/JP2015/000813 dated May 19, 2015.
International Search Report of PCT application No. PCT/JP2015/000814 dated May 26, 2015.
International Search Report of PCT application No. PCT/JP2015/000815 dated Apr. 7, 2015.
International Search Report of PCT application No. PCT/JP2014/004324 dated Nov. 25, 2014; with English translation.
Specification of U.S. Appl. No. 15/169,771, filed Jun. 1, 2016.
Specification of U.S. Appl. No. 15/206,273, filed Jul. 10, 2016.
Specification of U.S. Appl. No. 15/214,523, filed Jul. 20, 2016.

(56) References Cited

OTHER PUBLICATIONS

Specification of U.S. Appl. No. 15/214,803, filed Jul. 20, 2016.
Specification of U.S. Appl. No. 15/214,837, filed Jul. 20, 2016.
Specification of U.S. Appl. No. 15/215,592, filed Jul. 21, 2016.
Specification of U.S. Appl. No. 15/215,595, filed Jul. 21, 2016.
Specification of U.S. Appl. No. 15/215,599, filed Jul. 21, 2016.
Specification of U.S. Appl. No. 15/216,669, filed Jul. 21, 2016.
Specification of U.S. Appl. No. 15/216,686, filed Jul. 21, 2016.
Specification of U.S. Appl. No. 15/219,462, filed Jul. 26, 2016.
Non-Final Office Action issued in U.S. Appl. No. 15/169,771, dated Aug. 16, 2017.
Non-Final Office Action issued in U.S. Appl. No. 15/214,803, dated Aug. 8, 2017.
Non-Final Office Action issued in U.S. Appl. No. 15/214,837, dated Sep. 12, 2017.
Non-Final Office Action issued in U.S. Appl. No. 15/215,595, dated Jul. 28, 2017.
Notice of Allowance issued in U.S. Appl. No. 15/215,595, dated Sep. 22, 2017.
Non-Final Office Action issued in U.S. Appl. No. 15/215,599, dated Aug. 25, 2017.
Non-Final Office Action issued in U.S. Appl. No. 15/219,462, dated Sep. 26, 2017.
Notice of Allowance issued in U.S. Appl. No. 15/169,771, dated Oct. 24, 2017.
Specification of U.S. Appl. No. 15/446,453, filed Mar. 1, 2017.
Non-Final Office Action issued in U.S. Appl. No. 15/216,669, dated Apr. 14, 2017.
Notice of Allowance issued in U.S. Appl. No. 15/060,564, dated Mar. 21, 2018.
Notice of Allowance issued in U.S. Appl. No. 15/216,686, dated Mar. 26, 2018.
Final Office Action issued in U.S. Appl. No. 15/215,592, dated Apr. 9, 2018.
Non-Final Office Action issued in U.S. Appl. No. 15/219,462, dated Feb. 28, 2018.

* cited by examiner

LIGHT-EMITTING DEVICE INCLUDING PHOTOLUMINESCENT LAYER

BACKGROUND

1. Technical Field

The present disclosure relates to a light-emitting device and a light-emitting apparatus each having a photoluminescent layer that can emit light in the infrared region.

2. Description of the Related Art

Infrared rays (hereinafter also referred to as "infrared light") are utilized in various applications. For example, infrared rays are utilized for observation of the interior of the living body, examination of the composition of substances, such as foods and chemicals, biometric authentication, and infrared communication. These applications require precise irradiation of the target with infrared rays in a predetermined wavelength range.

In general, photoluminescent materials that emit electromagnetic waves, such as infrared light and visible light, emit light in all directions. Thus, emission of an electromagnetic wave in a particular direction often requires an optical component, such as a reflector or lens. For example, Japanese Unexamined Patent Application Publication No. 2010-231941 discloses a visible light illumination system with sufficient directionality including a light distributor and an auxiliary reflector.

SUMMARY

In one general aspect, the techniques disclosed here feature a light-emitting device that includes: a photoluminescent layer that has a first surface perpendicular to a thickness direction thereof and emits light including first light in an infrared region, an area of the first surface being larger than a sectional area of the photoluminescent layer perpendicular to the first surface, the first light having a wavelength $\lambda_a$ in air; and a light-transmissive layer located on the photoluminescent layer. At least one of the photoluminescent layer and the light-transmissive layer has a periodic structure having projections or recesses or both arranged perpendicular to the thickness direction of the photoluminescent layer. At least one of the photoluminescent layer and the light-transmissive layer has a light emitting surface perpendicular to the thickness direction of the photoluminescent layer, the first light being emitted from the light emitting surface. A refractive index $n_{wav-a}$ of the photoluminescent layer for the first light and a period $p_a$ of the periodic structure satisfy $\lambda_a/n_{wav-a} < p_a < \lambda_a$. A thickness of the photoluminescent layer, the refractive index $n_{wav-a}$ and the period $p_a$ are set to limit a directional angle of the first light emitted from the light emitting surface.

General or specific embodiments may be implemented as a device, an apparatus, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
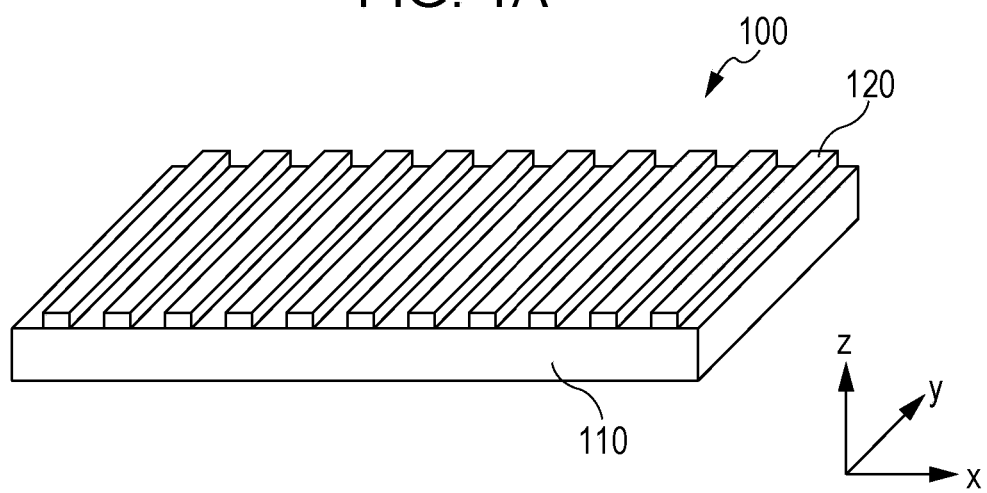
FIG. 1A is a perspective view of the structure of a light-emitting device according to an embodiment.

The present disclosure includes the following light-emitting devices:

[Item 1]

A light-emitting device including a photoluminescent layer that emits light including first light in an infrared region, the first light having a wavelength $\lambda_a$ in air, and a light-transmissive layer located on or near the photoluminescent layer, wherein at least one periodic structure is defined on at least one of the photoluminescent layer and the light-transmissive layer, the at least one periodic structure has projections or recesses or both, and a refractive index $n_{wav-a}$ of the photoluminescent layer for the first light and a period $p_a$ of the at least one periodic structure satisfy $\lambda_a/n_{wav-a} < p_a < \lambda_a$.

[Item 2]

The light-emitting device according to Item 1, wherein the refractive index $n_{t-a}$ of the light-transmissive layer for the first light is lower than the refractive index $n_{wav-a}$ of the photoluminescent layer for the first light.

[Item 3]

The light-emitting device according to Item 1 or 2, wherein the first light has maximum intensity in a first direction predetermined by the periodic structure.

[Item 4]

The light-emitting device according to Item 3, wherein the first light has a directional angle of less than 15 degrees with respect to the first direction.

[Item 5]

A light-emitting device including a photoluminescent layer that emits light including light in an infrared region, and a light-transmissive layer located on or near the photoluminescent layer, wherein at least one periodic structure is defined on at least one of the photoluminescent layer and the light-transmissive layer, the at least one periodic structure has projections or recesses or both, and a wavelength $\lambda_{ex}$ of excitation light in air, the excitation light exciting a photoluminescent material contained in the photoluminescent layer, a refractive index $n_{wav\text{-}ex}$ of the photoluminescent layer for the excitation light, and a period $p_{ex}$ of the at least one periodic structure satisfy $\lambda_{ex}/n_{wav\text{-}ex} < p_{ex} < \lambda_{ex}$.

[Item 6]

A light-emitting device including a light-transmissive layer having at least one periodic structure, and a photoluminescent layer that is located on or near the at least one periodic structure and emits light including first light in an infrared region, the first light having a wavelength $\lambda_a$ in air, wherein the at least one periodic structure has projections or recesses or both, and a refractive index $n_{wav\text{-}a}$ of the photoluminescent layer for the first light and a period $p_a$ of the at least one periodic structure satisfy $\lambda_a/n_{wav\text{-}a} < p_a < \lambda_a$.

[Item 7]

A light-emitting device including a photoluminescent layer that emits light including first light in an infrared region, the first light having a wavelength $\lambda_a$ in air, and a light-transmissive layer having a higher refractive index than the photoluminescent layer for the first light, wherein at least one periodic structure is defined on the light-transmissive layer, the at least one periodic structure has projections or recesses or both, and a refractive index $n_{wav\text{-}a}$ of the photoluminescent layer for the first light and a period $p_a$ of the at least one periodic structure satisfy $\lambda_a/n_{wav\text{-}a} < p_a < \lambda_a$.

[Item 8]

The light-emitting device according to any one of Items 1 to 7, wherein the photoluminescent layer is in contact with the light-transmissive layer.

[Item 9]

A light-emitting device including a photoluminescent layer that emits light including first light in an infrared region, the first light having a wavelength $\lambda_a$ in air, wherein at least one periodic structure is defined on the photoluminescent layer, the at least one periodic structure has projections or recesses or both, and a refractive index $n_{wav\text{-}a}$ of the photoluminescent layer for the first light and a period $p_a$ of the at least one periodic structure satisfy $\lambda_a/n_{wav\text{-}a} < p_a < \lambda_a$.

A light-emitting device according to an embodiment of the present disclosure includes a photoluminescent layer that emits light in an infrared region, a light-transmissive layer located on or near the photoluminescent layer, and at least one periodic structure formed on at least one of the photoluminescent layer and the light-transmissive layer. The periodic structure has projections or recesses or both. Light from the photoluminescent layer includes first light having a wavelength $\lambda_a$ in air. The distance $D_{int}$ between adjacent projections or recesses and the refractive index $n_{wav\text{-}a}$ of the photoluminescent layer for the first light satisfy $\lambda_a/n_{wav\text{-}a} < D_{int} < \lambda_a$. The wavelength $\lambda_a$ is in a near- or mid-infrared wavelength range (approximately 0.75 to 4 µm). In the present specification, this wavelength range is referred to as an "infrared region", and electromagnetic waves in the infrared region (infrared rays) may also be referred to as "light".

The photoluminescent layer contains a photoluminescent material that emits light in the infrared region. The term "photoluminescent material" refers to a material that emits light in response to excitation light. The term "photoluminescent material" encompasses fluorescent materials and phosphorescent materials in a narrow sense, encompasses inorganic materials and organic materials (for example, dyes), and encompasses quantum dots (that is, tiny semiconductor particles). The photoluminescent layer may contain a matrix material (host material) in addition to the photoluminescent material. Examples of matrix materials include resins and inorganic materials, such as glasses and oxides.

The light-transmissive layer located on or near the photoluminescent layer is formed of a material, for example, an inorganic material or resin, having high transmittance to light emitted from the photoluminescent layer. For example, the light-transmissive layer is formed of a dielectric material (particularly, an insulator having low light absorptivity). The light-transmissive layer may also be a substrate that supports the photoluminescent layer. If the surface of the photoluminescent layer facing air has a periodic structure, an air layer can serve as the light-transmissive layer.

In a light-emitting device according to an embodiment of the present disclosure, a periodic structure on at least one of the photoluminescent layer and the light-transmissive layer forms a unique electric field distribution inside the photoluminescent layer and the light-transmissive layer, as described in detail later with reference to the results of calculations and experiments. This electric field distribution is formed by an interaction between guided light and the periodic structure and may also be referred to as a "quasi-guided mode". The quasi-guided mode can be utilized to improve the luminous efficiency, directionality, and polarization selectivity of photoluminescence, as described later. The term "quasi-guided mode" may be used in the following description to describe novel structures and/or mechanisms contemplated by the inventors. Such a description is for illustrative purposes only and is not intended to limit the present disclosure in any way.

The periodic structure has projections or recesses or both, and the distance (the center-to-center distance) $D_{int}$ between adjacent projections satisfies $\lambda_a/n_{wav\text{-}a} < D_{int} < \lambda_a$. In other words, the periodic structure has a period $p_a$ that satisfies $\lambda_a/n_{wav\text{-}a} < p_a < \lambda_a$. The symbol $\lambda$ denotes the wavelength of light, and the symbol $\lambda_a$ denotes the wavelength of light in air. The symbol $n_{wav}$ denotes the refractive index of the photoluminescent layer. If the photoluminescent layer is a medium containing a mixture of materials, the refractive index $n_{wav}$ denotes the average refractive index of the materials weighted by their respective volume fractions. Although it is desirable to use the symbol $n_{wav\text{-}a}$ to refer to the refractive index for light having a wavelength $\lambda_a$ because the refractive index n generally depends on the wavelength, it may be abbreviated for simplicity. The symbol $n_{wav}$ basically denotes the refractive index of the photoluminescent layer; however, if a layer having a higher refractive index than the photoluminescent layer is adjacent to the photoluminescent layer, the refractive index $n_{wav}$ denotes the average refractive index of the layer having the higher refractive index and the photoluminescent layer weighted by their respective volume fractions. This situation is optically equivalent to a photoluminescent layer composed of layers of different materials.

The effective refractive index $n_{eff}$ of the medium for light in the quasi-guided mode satisfies $n_a<n_{eff}<n_{wav}$, wherein $n_a$ denotes the refractive index of air. If light in the quasi-guided mode propagates through the photoluminescent layer while being totally reflected at an incident angle θ, the effective refractive index $n_{eff}$ can be written as $n_{eff}=n_{wav}$ sin θ. The effective refractive index $n_{eff}$ is determined by the refractive index of the medium present in the region where the electric field of the quasi-guided mode is distributed. For example, if the periodic structure is formed in the light-transmissive layer, the effective refractive index $n_{eff}$ depends not only on the refractive index of the photoluminescent layer but also on the refractive index of the light-transmissive layer. Because the electric field distribution also varies with the polarization direction of the quasi-guided mode (TE mode or TM mode), the effective refractive index $n_{eff}$ can differ between the TE mode and the TM mode.

The periodic structure is formed on at least one of the photoluminescent layer and the light-transmissive layer. If the photoluminescent layer and the light-transmissive layer are in contact with each other, the periodic structure may be formed at the interface between the photoluminescent layer and the light-transmissive layer. In such a case, the photoluminescent layer and the light-transmissive layer have the periodic structure. The photoluminescent layer may have no periodic structure. In such a case, a light-transmissive layer having a periodic structure is located on or near the photoluminescent layer. A phrase like "a light-transmissive layer (or its periodic structure) located on or near the photoluminescent layer", as used herein, typically means that the distance between these layers is less than half the wavelength $\lambda_a$. This allows the electric field in a guided mode to reach the periodic structure, thus forming a quasi-guided mode. However, the distance between the periodic structure of the light-transmissive layer and the photoluminescent layer may exceed half the wavelength $\lambda_a$ if the light-transmissive layer has a higher refractive index than the photoluminescent layer, because light reaches the light-transmissive layer even if the above relationship is not satisfied. In the present specification, if the photoluminescent layer and the light-transmissive layer have a positional relationship that allows the electric field in a guided mode to reach the periodic structure and form a quasi-guided mode, they may be associated with each other.

The periodic structure, which satisfies $\lambda_a/n_{wav-a}<D_{int}<\lambda_a$, as described above, is characterized by the wavelength. The periodic structure is not limited to a single periodic structure and may include two or more periodic structures, as in a light-emitting device according to an embodiment described in detail later. Light in the quasi-guided mode interacts repeatedly with the periodic structure during propagation and is diffracted by the periodic structure. Unlike the phenomenon in which light propagating through free space is diffracted by a periodic structure, this is the phenomenon in which light is guided (that is, repeatedly totally reflected) while interacting with the periodic structure. This can efficiently diffract light even if the periodic structure causes a small phase shift (that is, even if the periodic structure has a small height).

The above mechanism can be utilized to improve the luminous efficiency of photoluminescence by the enhancement of the electric field due to the quasi-guided mode and also to couple emitted light into the quasi-guided mode. The angle of travel of light in the quasi-guided mode is changed by the angle of diffraction determined by the periodic structure. This can be utilized to emit light of a particular wavelength in a particular direction and significantly improve the directionality of light. Furthermore, high polarization selectivity can be simultaneously achieved because the effective refractive index $n_{eff}$ ($=n_{wav}$ sin θ) differs between the TE mode and the TM mode. For example, as demonstrated by the experimental examples below, a light-emitting device can be provided that emits intense linearly polarized light (for example, the TM mode) having a particular wavelength (for example, 1000 nm) in the front direction. The directional angle of light emitted in the front direction is less than 15 degrees, for example. The term "directional angle" refers to the angle of one side with respect to the front direction, which is assumed to be 0 degrees.

A periodic structure having lower periodicity results in lower directionality, luminous efficiency, polarization, and wavelength selectivity. The periodicity of the periodic structure may be adjusted depending on the need. The periodic structure may be a one-dimensional periodic structure, which has higher polarization selectivity, or a two-dimensional periodic structure, which allows for lower polarization.

At least one of the photoluminescent layer and the light-transmissive layer may include periodic structures. These periodic structures may have different periods or different periodic directions (axes). The periodic structures may be formed on the same plane or may be formed (stacked) on different planes. The light-emitting device may include photoluminescent layers and light-transmissive layers, and each of the layers may have periodic structures.

The periodic structure can be used not only to control light emitted from the photoluminescent layer but also to efficiently guide excitation light into the photoluminescent layer. That is, excitation light can be diffracted by the periodic structure and coupled into the quasi-guided mode that guides light in the photoluminescent layer and the light-transmissive layer and thereby can efficiently excite the photoluminescent layer. The periodic structure satisfies $\lambda_{ex}/n_{wav-ex}<D_{int}<\lambda_{ex}$, wherein $\lambda_{ex}$ denotes the wavelength of excitation light in air, the excitation light exciting the photoluminescent material, and $n_{wav-ex}$ denotes the refractive index of the photoluminescent layer for the excitation light. The symbol $n_{wav-ex}$ denotes the refractive index of the photoluminescent layer at the emission wavelength of the photoluminescent material. Alternatively, the periodic structure may include a periodic structure having a period $p_{ex}$ that satisfies $\lambda_{ex}/n_{wav-ex}<p_{ex}<\lambda_{ex}$. The excitation light has a wavelength $\lambda_{ex}$ of 450 nm, for example, but may have a shorter wavelength than visible light. If the excitation light has a wavelength in the visible range, the excitation light may be emitted together with infrared light emitted from the photoluminescent layer.

1. Underlying Knowledge Forming Basis of the Present Disclosure

The underlying knowledge forming the basis for the present disclosure will be described before describing specific embodiments of the present disclosure. As described above, photoluminescent materials, such as those used for fluorescent lamps and white LEDs, emit light in all directions and thus require an optical element, such as a reflector or lens, to emit light in a particular direction. These optical elements, however, can be eliminated (or the size thereof can be reduced) if the photoluminescent layer itself emits directional light. This results in a significant reduction in the size of optical devices and equipment. With this idea in mind, the inventors have conducted a detailed study on the photoluminescent layer to achieve directional light emission.

The inventors have investigated the possibility of inducing light emission with particular directionality so that light from the photoluminescent layer is localized in a particular direction. Based on Fermi's golden rule, the emission rate Γ, which is a measure characterizing light emission, is represented by the formula (1):

$$\Gamma(r) = \frac{2\pi}{\hbar} \langle (d \cdot E(r)) \rangle^2 \rho(\lambda) \qquad (1)$$

In the formula (1), r denotes the vector indicating the position, λ denotes the wavelength of light, d denotes the dipole vector, E denotes the electric field vector, and ρ denotes the density of states. In many substances other than some crystalline substances, the dipole vector d is randomly oriented. The magnitude of the electric field E is substantially constant irrespective of the direction if the size and thickness of the photoluminescent layer are sufficiently larger than the wavelength of light. Hence, in most cases, the value of $\langle (d \cdot E(r)) \rangle^2$ is independent of the direction. Accordingly, the emission rate Γ is constant irrespective of the direction. Thus, in most cases, the photoluminescent layer emits light in all directions.

As can be seen from the formula (1), to achieve anisotropic light emission, it is necessary to align the dipole vector d in a particular direction or to enhance a component of the electric field vector in a particular direction. One of these approaches can be employed to achieve directional light emission. In the present disclosure, the results of a detailed study and analysis on structures for utilizing a quasi-guided mode in which an electric field component in a particular direction is enhanced by the confinement of light in the photoluminescent layer will be described below.

2. Structure for Enhancing Electric Field Only in Particular Direction

The inventors have investigated the possibility of controlling light emission using a guided mode with an intense electric field. Light can be coupled into a guided mode using a waveguide structure that itself contains a photoluminescent material. However, a waveguide structure simply formed using a photoluminescent material emits little or no light in the front direction because the emitted light is coupled into a guided mode. Accordingly, the inventors have investigated the possibility of combining a waveguide containing a photoluminescent material with a periodic structure including projections or recesses or both. When the electric field of light is guided in a waveguide while overlapping with a periodic structure located on or near the waveguide, a quasi-guided mode is formed by the effect of the periodic structure. That is, the quasi-guided mode is a guided mode restricted by the periodic structure and is characterized in that the antinodes of the amplitude of the electric field have the same period as the periodic structure. Light in this mode is confined in the waveguide structure to enhance the electric field in a particular direction. This mode also interacts with the periodic structure and undergoes diffraction, so that light in this mode is converted into light propagating in a particular direction and can be emitted from the waveguide. The electric field of light other than the quasi-guided mode is not enhanced because little or no such light is confined in the waveguide. Thus, most light is coupled into a quasi-guided mode with a large electric field component.

That is, the inventors have investigated the possibility of using a photoluminescent layer containing a photoluminescent material as a waveguide (or a waveguide layer including a photoluminescent layer) in combination with a periodic structure located on or near the waveguide to couple light into a quasi-guided mode in which the light is converted into light propagating in a particular direction, thereby providing a directional light source.

Figure 30:
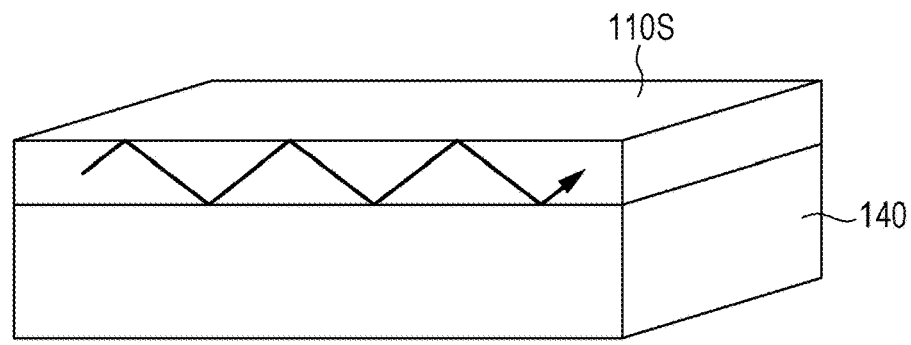
FIG. 30 is a schematic perspective view of a slab waveguide.

As a simple waveguide structure, the inventors have studied slab waveguides. A slab waveguide has a planar structure in which light is guided. FIG. 30 is a schematic perspective view of a slab waveguide 110S. There is a mode of light propagating through the waveguide 110S if the waveguide 110S has a higher refractive index than a transparent substrate 140 that supports the waveguide 110S. If such a slab waveguide includes a photoluminescent layer, the electric field of infrared light emitted from an emission point overlaps largely with the electric field of a guided mode. This allows most of the infrared light emitted from the photoluminescent layer to be coupled into the guided mode. If the photoluminescent layer has a thickness close to the wavelength of light, a situation can be created where there is only a guided mode with a large electric field amplitude.

If a periodic structure is located on or near the photoluminescent layer, the electric field of the guided mode interacts with the periodic structure to form a quasi-guided mode. Even if the photoluminescent layer is composed of multiple layers, a quasi-guided mode is formed as long as the electric field of the guided mode reaches the periodic structure. Not all parts of the photoluminescent layer needs to be formed of a photoluminescent material, provided that at least a portion of the photoluminescent layer functions to emit light.

If the periodic structure is formed of a metal, a mode due to the guided mode and plasmon resonance is formed. This mode has different properties from the quasi-guided mode. This mode is less effective in enhancing emission because a large loss occurs due to high absorption by the metal. Thus, it is desirable to form the periodic structure using a dielectric material having low absorptivity.

Figure 1B:
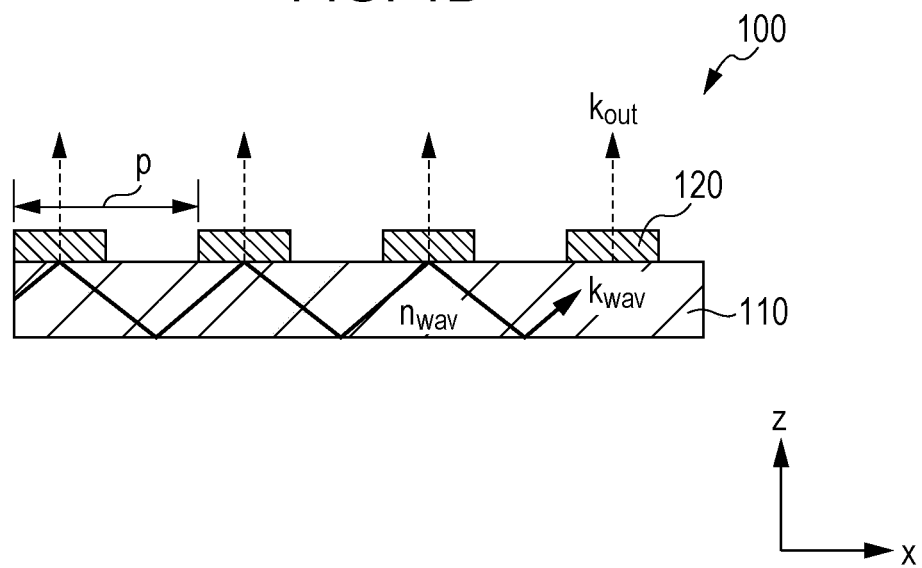
FIG. 1B is a fragmentary cross-sectional view of the light-emitting device illustrated in FIG. 1A.

The inventors have studied the coupling of light into a quasi-guided mode that can be output as light propagating in a particular angular direction using a periodic structure formed on a waveguide (for example, a photoluminescent layer). FIG. 1A is a schematic perspective view of a light-emitting device 100 including a waveguide (for example, a photoluminescent layer) 110 and a periodic structure (for example, a light-transmissive layer) 120. The light-transmissive layer 120 is hereinafter also referred to as a periodic structure 120 if the light-transmissive layer 120 forms a periodic structure (that is, if a structure having periodic variations in refractive index is formed on the light-transmissive layer 120). In this example, the periodic structure 120 is a one-dimensional periodic structure in which stripe-shaped projections extending in the y direction are arranged at regular intervals in the x direction. FIG. 1B is a cross-sectional view of the light-emitting device 100 taken along a plane parallel to the xz plane. If a periodic structure 120 having a period p is provided in contact with the waveguide 110, a quasi-guided mode having a wave number $k_{wav}$ in the in-plane direction is converted into light propagating outside the waveguide 110. The wave number $k_{out}$ of the light can be represented by the formula (2):

$$k_{out} = k_{wav} - m\frac{2\pi}{p} \quad (2)$$

wherein m is an integer indicating the diffraction order.

For simplicity, light guided in the waveguide 110 is assumed to be a ray of light propagating at an angle $\theta_{wav}$. This approximation gives the formulae (3) and (4):

$$\frac{k_{wav}\lambda_0}{2\pi} = n_{wav}\sin\theta_{wav} \quad (3)$$

$$\frac{k_{out}\lambda_0}{2\pi} = n_{out}\sin\theta_{out} \quad (4)$$

In these formulae, $\lambda_0$ denotes the wavelength of the light in air, $n_{wav}$ denotes the refractive index of the waveguide 110, $n_{out}$ denotes the refractive index of the medium on the light output side, and $\theta_{out}$ denotes the angle at which the light is emitted from the waveguide 110 to a substrate or to the air. From the formulae (2) to (4), the output angle $\theta_{out}$ can be represented by the equation (5):

$$n_{out} \sin \theta_{out} = n_{wav} \sin \theta_{wav} - m\lambda_0/p \quad (5)$$

If $n_{wav} \sin \theta_{wav} = m\lambda_0/p$ in the formula (5), this results in $\theta_{out}=0$, meaning that the light can be emitted in the direction perpendicular to the plane of the waveguide 110 (that is, in the front direction).

Based on this principle, light can be coupled into a particular quasi-guided mode and be converted into light having a particular output angle using the periodic structure to emit intense light in that direction.

There are some constraints to achieving the above situation. To form a quasi-guided mode, light propagating through the waveguide 110 has to be totally reflected. The conditions therefor are represented by the formula (6):

$$n_{out} < n_{wav} \sin \theta_{wav} \quad (6)$$

To diffract the quasi-guided mode using the periodic structure and thereby emit light from the waveguide 110, $-1 < \sin \theta_{out} < 1$ has to be satisfied in the formula (5). Hence, the following formula (7) has to be satisfied:

$$-1 < \frac{n_{wav}}{n_{out}}\sin\theta_{wav} - \frac{m\lambda_0}{n_{out}p} < 1 \quad (7)$$

Taking into account the formula (6), the formula (8) has to be satisfied:

$$\frac{m\lambda_0}{2n_{out}} < p \quad (8)$$

To emit light from the waveguide 110 in the front direction ($\theta_{out}=0$), as can be seen from the formula (5), the formula (9) has to be satisfied:

$$p = m\lambda_0/(n_{wav} \sin \theta_{wav}) \quad (9)$$

As can be seen from the formulae (9) and (6), the required conditions are represented by the formula (10):

$$\frac{m\lambda_0}{n_{wav}} < p < \frac{m\lambda_0}{n_{out}} \quad (10)$$

The periodic structure as illustrated in FIGS. 1A and 1B may be designed based on first-order diffracted light (that is, m=1) because higher-order diffracted light having m of 2 or more has low diffraction efficiency. In this embodiment, the period p of the periodic structure 120 is determined so as to satisfy the formula (11), which is given by substituting m=1 into the formula (10):

$$\frac{\lambda_0}{n_{wav}} < p < \frac{\lambda_0}{n_{out}} \quad (11)$$

If the waveguide (photoluminescent layer) 110 is not in contact with a transparent substrate, as illustrated in FIGS. 1A and 1B, $n_{out}$ is equal to the refractive index of air (approximately 1.0). Thus, the period p is determined so as to satisfy the formula (12):

$$\frac{\lambda_0}{n_{wav}} < p < \lambda_0 \quad (12)$$

Figure 1C:
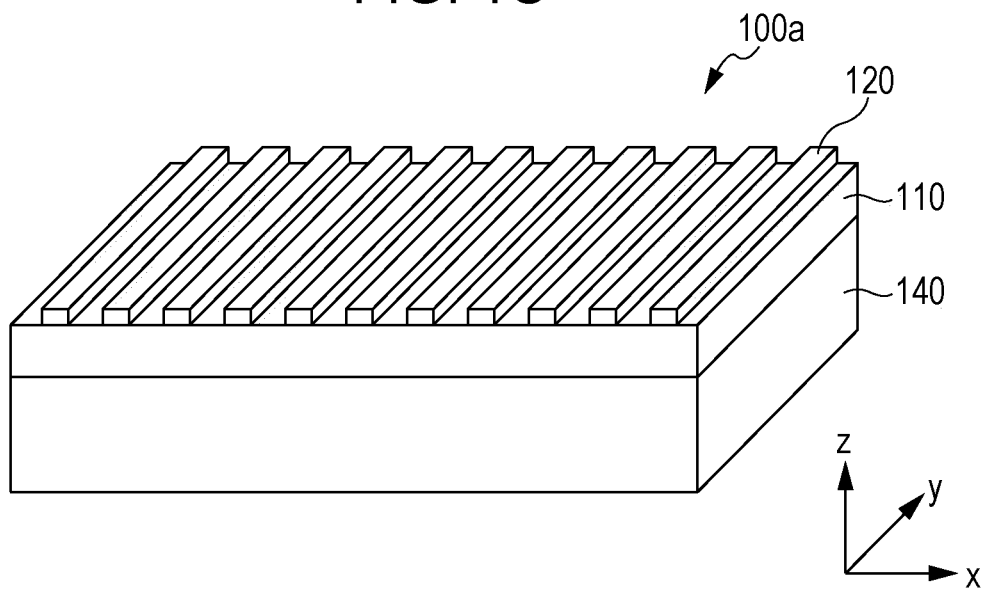
FIG. 1C is a perspective view of the structure of a light-emitting device according to another embodiment.
Figure 1D:
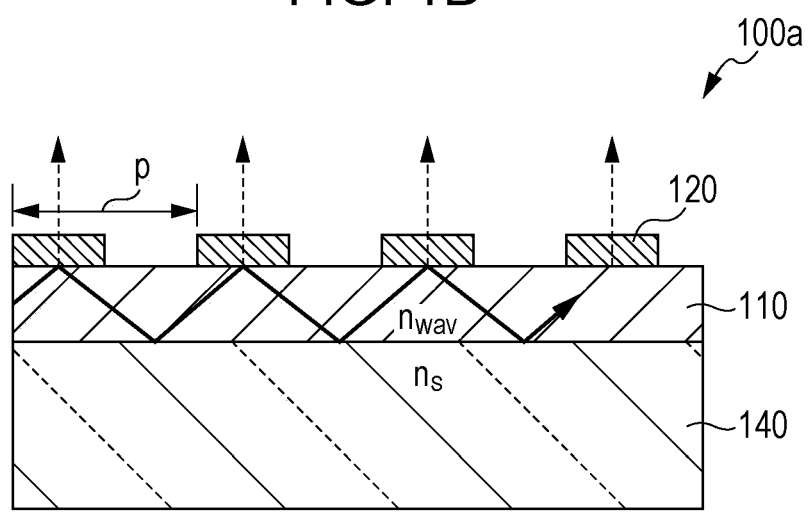
FIG. 1D is a fragmentary cross-sectional view of the light-emitting device illustrated in FIG. 1C.

Alternatively, a structure as illustrated in FIGS. 1C and 1D may be employed in which the photoluminescent layer 110 and the periodic structure 120 are formed on a transparent substrate 140. The refractive index $n_s$ of the transparent substrate 140 is higher than the refractive index of air. Thus, the period p is determined so as to satisfy the formula (13), which is given by substituting $n_{out}=n_s$ into the formula (11):

$$\frac{\lambda_0}{n_{wav}} < p < \frac{\lambda_0}{n_s} \quad (13)$$

Although m=1 is assumed in the formula (10) to give the formulae (12) and (13), m may be 2 or more. That is, if both surfaces of the light-emitting device 100 are in contact with air layers, as shown in FIGS. 1A and 1B, the period p may be determined so as to satisfy the formula (14):

$$\frac{m\lambda_0}{n_{wav}} < p < m\lambda_0 \quad (14)$$

wherein m is an integer of 1 or more.

Similarly, if the photoluminescent layer 110 is formed on the transparent substrate 140, as in the light-emitting device 100a illustrated in FIGS. 1C and 1D, the period p may be determined so as to satisfy the formula (15):

$$\frac{m\lambda_0}{n_{wav}} < p < \frac{m\lambda_0}{n_s} \quad (15)$$

By determining the period p of the periodic structure so as to satisfy the above formulae, light from the photoluminescent layer 110 can be emitted in the front direction. Thus, a directional light emitting device can be provided.

3. Verification by Calculations 3-1. Period and Wavelength Dependence

The inventors verified, by optical analysis, whether infrared light emission in a particular direction as described above is actually possible. The optical analysis was performed by calculations using DiffractMOD available from Cybernet Systems Co., Ltd. In these calculations, the change in the absorption of external light incident perpendicular to a light-emitting device by a photoluminescent layer was calculated to determine the enhancement of light output perpendicular to the light-emitting device. The calculation of the process by which external incident light is coupled into a quasi-guided mode and is absorbed by the photoluminescent layer corresponds to the calculation of a process opposite to the process by which light emitted from the photoluminescent layer is coupled into a quasi-guided mode and is converted into propagating light output perpendicular to the light-emitting device. Similarly, the electric field distribution of a quasi-guided mode was calculated from the electric field of external incident light.

Figure 2:
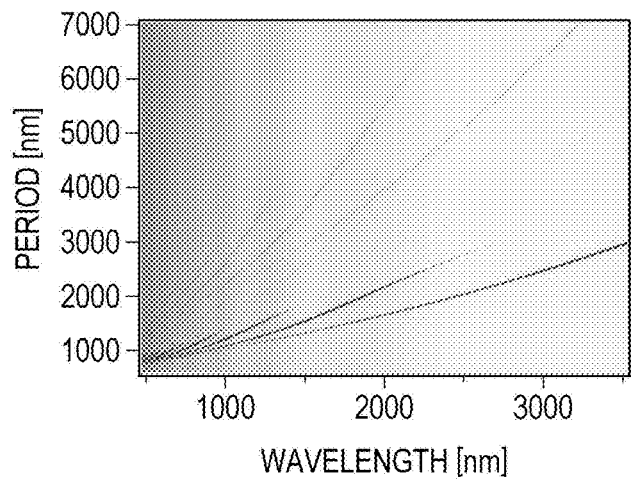
FIG. 2 is a graph showing the calculation results of the enhancement of light emitted in the front direction with varying emission wavelengths and varying a period of a periodic structure.

FIG. 2 shows the calculation results of the enhancement of infrared light emitted in the front direction with varying emission wavelengths and varying periods of the periodic structure. The photoluminescent layer had a thickness of 1 µm and a refractive index $n_{wav}$ of 1.8, and the periodic structure had a height of 100 nm and a refractive index of 1.8. In these calculations, the periodic structure was a one-dimensional periodic structure uniform in the y direction, as illustrated in FIG. 1A, and the polarization of light was in the TM mode, which has an electric field component parallel to the y direction. The results in FIG. 2 show that there are enhancement peaks at certain combinations of wavelength and period. In FIG. 2, the magnitude of the enhancement is expressed by different shades of color; a darker color (black) indicates a higher enhancement, whereas a lighter color (white) indicates a lower enhancement.

Figure 3:
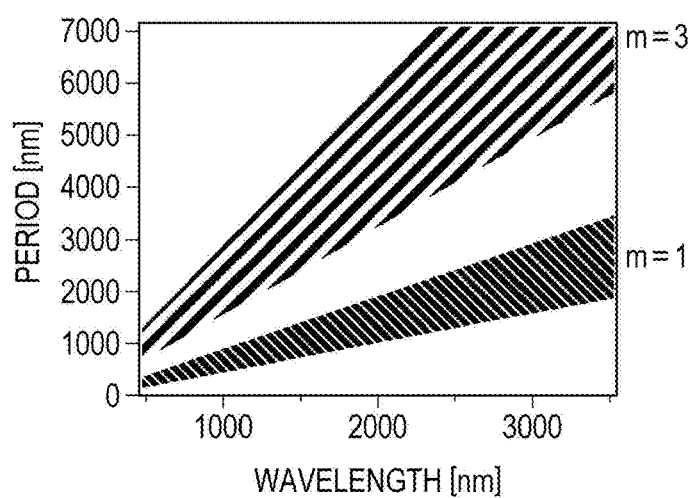
FIG. 3 is a graph illustrating the conditions for m=1 and m=3 in the formula (10)

In the above calculations, the periodic structure had a rectangular cross section as illustrated in FIG. 1B. FIG. 3 is a graph illustrating the conditions for m=1 and m=3 in the formula (10). A comparison between FIGS. 2 and 3 shows that the peaks in FIG. 2 are located within the regions corresponding to m=1 and m=3. The intensity is higher for m=1 because first-order diffracted light has a higher diffraction efficiency than third- or higher-order diffracted light. There is no peak for m=2 because of low diffraction efficiency in the periodic structure.

In FIG. 2, a plurality of lines are observed in each of the regions corresponding to m=1 and m=3 in FIG. 3. This indicates the presence of a plurality of quasi-guided modes.

3-2. Thickness Dependence

Figure 4:
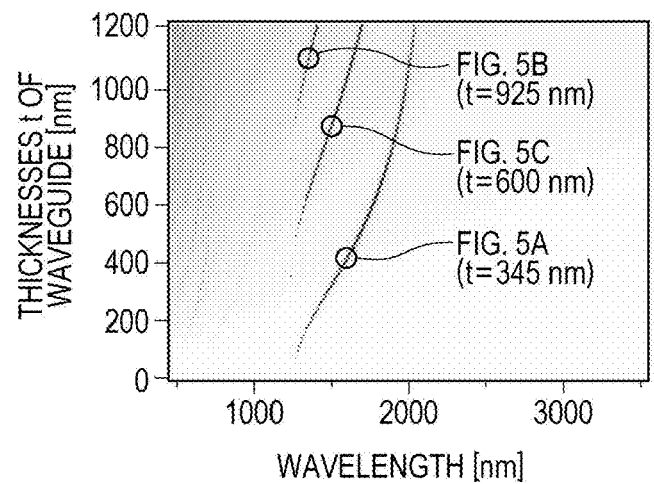
FIG. 4 is a graph showing the calculation results of the enhancement of light emitted in the front direction with varying emission wavelengths and varying thicknesses t of a photoluminescent layer.

FIG. 4 is a graph showing the calculation results of the enhancement of light emitted in the front direction with varying emission wavelengths and varying thicknesses t of the photoluminescent layer. The photoluminescent layer had a refractive index $n_{wav}$ of 1.8, and the periodic structure had a period of 1200 nm, a height of 100 nm, and a refractive index of 1.8. FIG. 4 shows that the enhancement of light is highest at a particular thickness t of the photoluminescent layer.

Figure 5A:
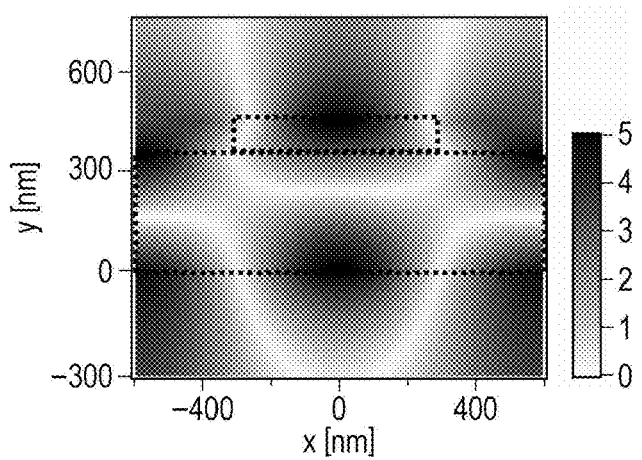
FIG. 5A is a graph showing the calculation results of the electric field distribution of a mode to guide light in the x direction for a thickness t of 345 nm.
Figure 5B:
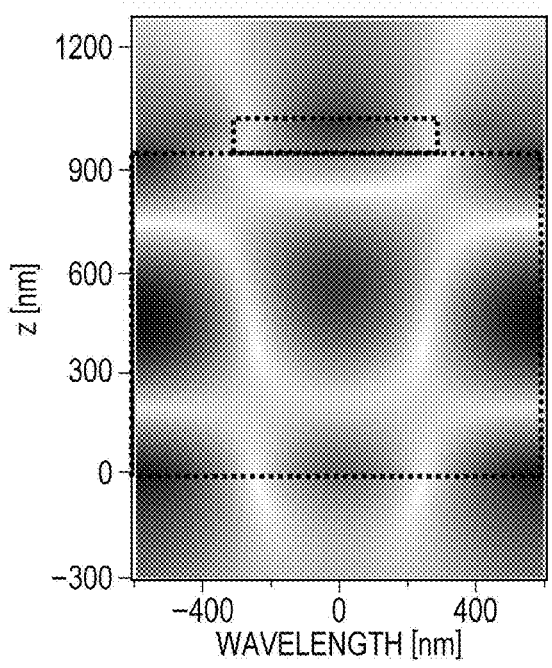
FIG. 5B is a graph showing the calculation results of the electric field distribution of a mode to guide light in the x direction for a thickness t of 925 nm.
Figure 5C:
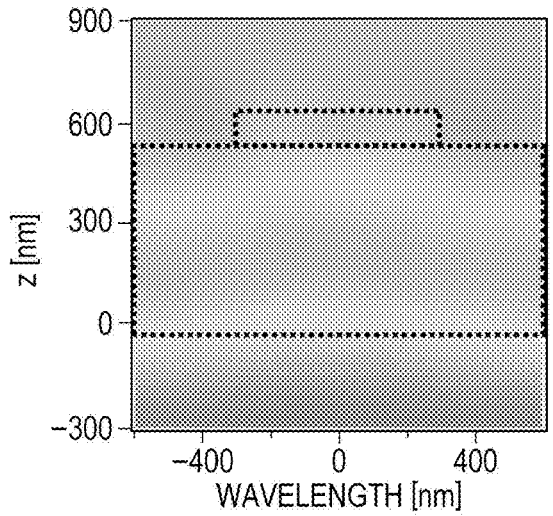
FIG. 5C is a graph showing the calculation results of the electric field distribution of a mode to guide light in the x direction for a thickness t of 600 nm.

FIGS. 5A and 5B show the calculation results of the electric field distributions in a mode to guide light in the x direction for a wavelength of 1500 nm and thicknesses t of 345 nm and 925 nm, respectively, at which there are peaks in FIG. 4. For comparison, FIG. 5C shows the results of similar calculations for a thickness t of 600 nm, at which there is no peak. In these calculations, as in the above calculations, the periodic structure was a one-dimensional periodic structure uniform in the y direction. In each figure, a black region indicates a higher electric field intensity, whereas a white region indicates a lower electric field intensity. Whereas the results for t=345 nm and t=925 nm show high electric field intensity, the results for t=600 nm show low electric field intensity as a whole. This is because there are guided modes for t=345 nm and t=925 nm so that light is strongly confined. Furthermore, regions with the highest electric field intensity (antinodes) are necessarily present in or directly below the projections, indicating the correlation between the electric field and the periodic structure 120. Thus, the resulting guided mode depends on the arrangement of the periodic structure 120. A comparison between the results for t=345 nm and t=925 nm shows that these modes differ by one in the number of nodes (white regions) of the electric field in the z direction.

3-3. Polarization Dependence

Figure 6:
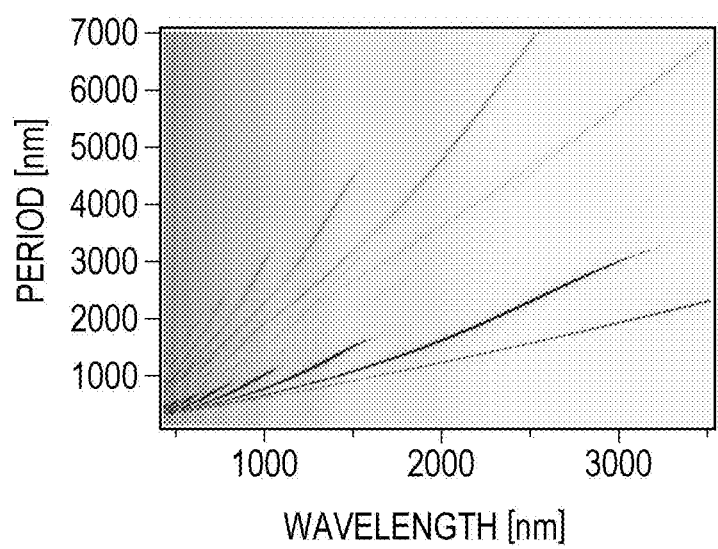
FIG. 6 is a graph showing the calculation results of the enhancement of light under the same conditions as in FIG. 2 except that the polarization of light is in the TE mode, which has an electric field component perpendicular to the y direction.

To examine the polarization dependence, the enhancement of light was calculated under the same conditions as in FIG. 2 except that the polarization of light was in the TE mode, which has an electric field component perpendicular to the y direction. FIG. 6 shows the results of these calculations. Although the peaks in FIG. 6 differ slightly in position from the peaks for the TM mode (FIG. 2), they are located within the regions shown in FIG. 3. This demonstrates that the structure according to this embodiment is effective for both the TM mode and the TE mode.

3-4. Two-Dimensional Periodic Structure

Figure 7A:
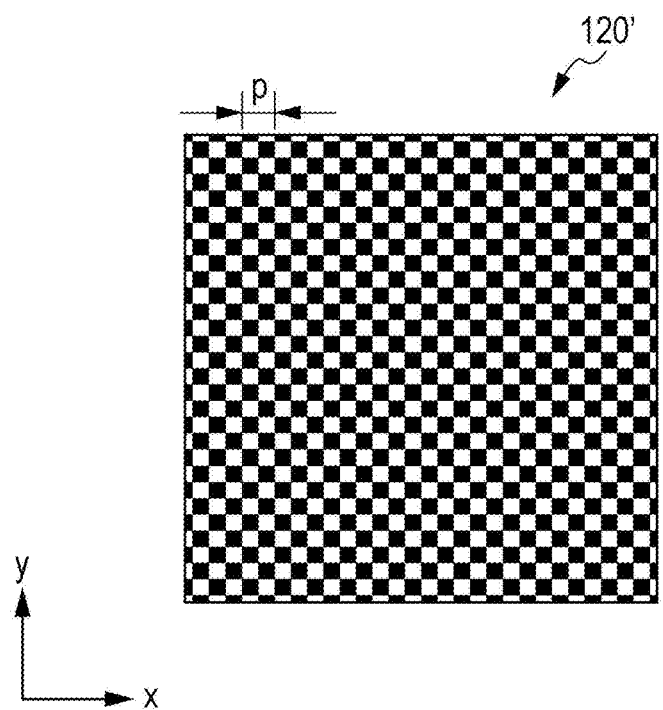
FIG. 7A is a plan view of a two-dimensional periodic structure.
Figure 7B:
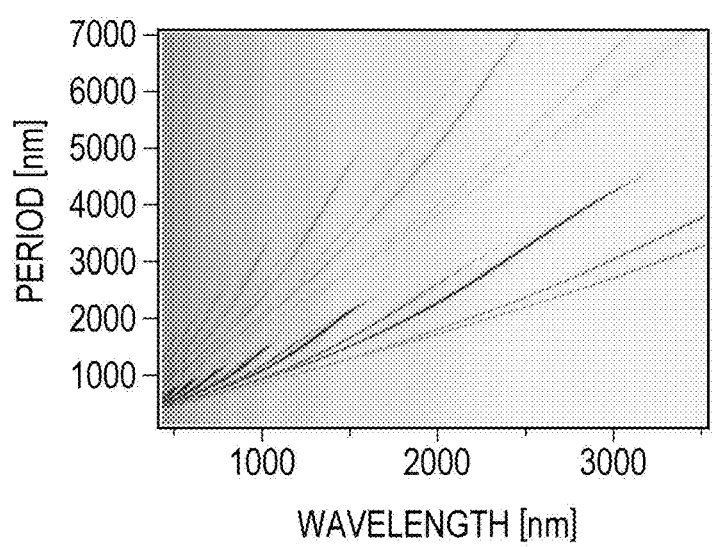
FIG. 7B is a graph showing the results of calculations performed as in FIG. 2 for the two-dimensional periodic structure.

The effect of a two-dimensional periodic structure was also studied. FIG. 7A is a partial plan view of a two-dimensional periodic structure 120' including recesses and projections arranged in both the x direction and the y direction. In FIG. 7A, the black regions indicate the projections, and the white regions indicate the recesses. For a two-dimensional periodic structure, both the diffraction in the x direction and the diffraction in the y direction have to be taken into account. Although the diffraction only in the x or y direction is similar to that in a one-dimensional periodic structure, a two-dimensional periodic structure can be expected to give different results from the one-dimensional periodic structure because diffraction also occurs in a direction containing both an x component and a y component (for example, at an angle of 45 degrees). FIG. 7B shows the calculation results of the enhancement of light for the two-dimensional periodic structure. The calculations were performed under the same conditions as in FIG. 2 except for the type of periodic structure. As shown in FIG. 7B, peaks matching the peaks for the TE mode in FIG. 6 were observed in addition to peaks matching the peaks for the TM mode in FIG. 2. These results demonstrate that the two-dimensional periodic structure also converts and outputs the TE mode by diffraction. For a two-dimensional periodic structure, diffraction that simultaneously satisfies the first-order diffraction conditions in both the x direction and the y direction also has to be taken into account. Such diffracted light is emitted at an angle corresponding to $\sqrt{2}$ times (that is, $2^{1/2}$ times) the period p. Thus, peaks will occur at $\sqrt{2}$ times the period p in addition to peaks that occur in a one-dimensional periodic structure. Such peaks are also observed in FIG. 7B.

Figure 18A:
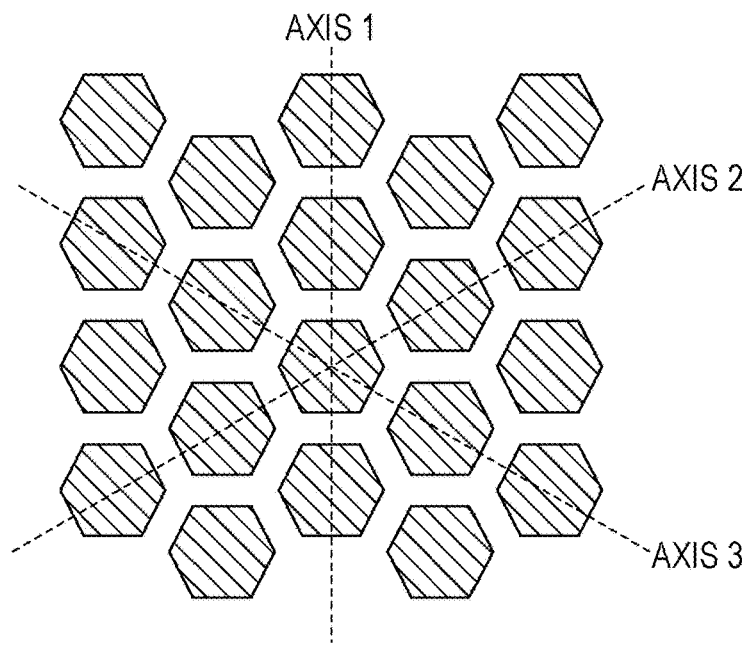
FIG. 18A is a schematic view of a two-dimensional periodic structure.
Figure 18B:
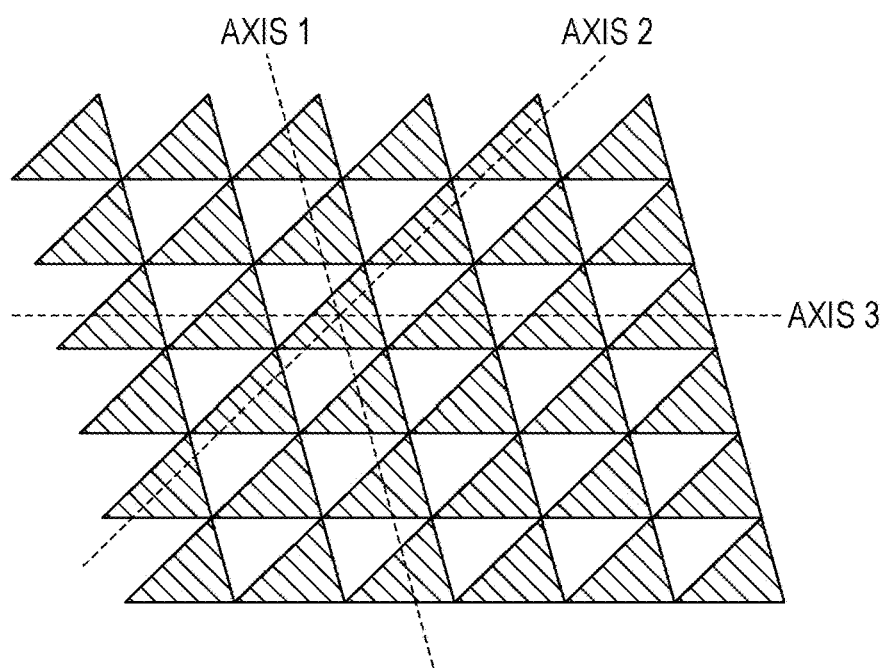
FIG. 18B is a schematic view of another two-dimensional periodic structure.

The two-dimensional periodic structure does not have to be a square grid structure having equal periods in the x direction and the y direction, as illustrated in FIG. 7A, but may be a hexagonal grid structure, as illustrated in FIG. 18A, or a triangular grid structure, as illustrated in FIG. 18B. The two-dimensional periodic structure may have different periods in different directions (for example, in the x direction and the y direction for a square grid structure).

In this embodiment, as demonstrated above, light in a characteristic quasi-guided mode formed by the periodic structure and the photoluminescent layer can be selectively emitted only in the front direction through diffraction by the periodic structure. With this structure, the photoluminescent layer can be excited with excitation light such as ultraviolet light or blue light to emit directional light.

4. Study on Constructions of Periodic Structure and Photoluminescent Layer

The effects of changes in various conditions such as the constructions and refractive indices of the periodic structure and the photoluminescent layer will now be described.

4-1. Refractive Index of Periodic Structure

Figure 8:
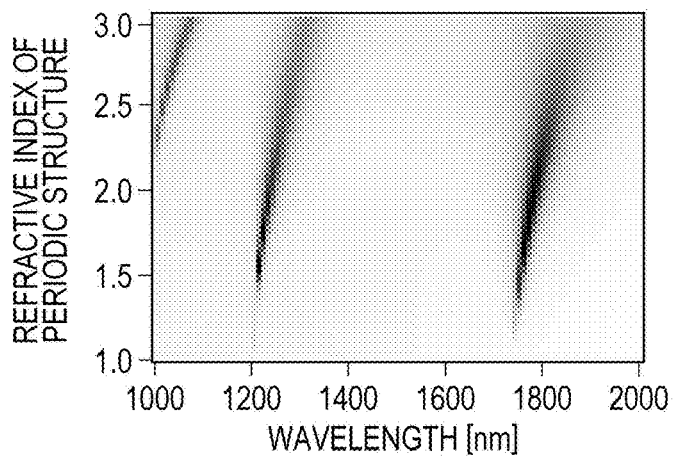
FIG. 8 is a graph showing the calculation results of the enhancement of light emitted in the front direction with varying emission wavelengths and varying refractive indices of the periodic structure.
Figure 9:
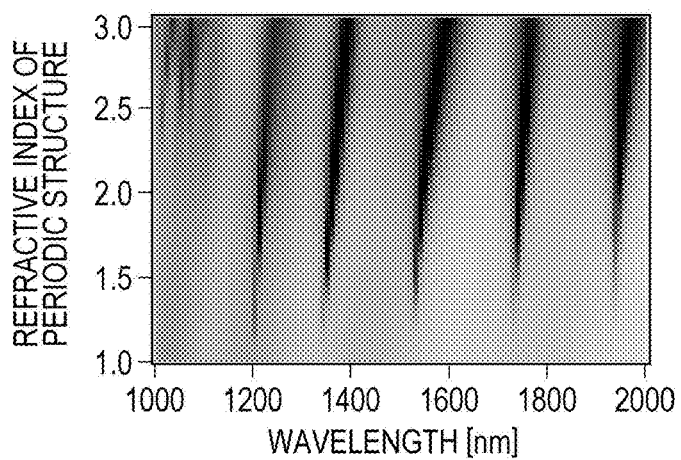
FIG. 9 is a graph showing the results obtained under the same conditions as in FIG. 8 except that the photoluminescent layer has a thickness of 2,000 nm.

The refractive index of the periodic structure was studied. In the calculations performed herein, the photoluminescent layer had a thickness t of 400 nm and a refractive index $n_{wav}$ of 1.8, the periodic structure was a one-dimensional periodic structure uniform in the y direction, as illustrated in FIG. 1A, and had a height h of 100 nm and a period p of 1200 nm, and the polarization of light was in the TM mode, which has an electric field component parallel to the y direction. FIG. 8 shows the calculation results of the enhancement of light emitted in the front direction with varying emission wavelengths and varying refractive indices of the periodic structure. FIG. 9 shows the results obtained under the same conditions except that the photoluminescent layer had a thickness t of 2000 nm.

The results show that the photoluminescent layer having a thickness of 2000 nm (FIG. 9) results in a smaller shift in the wavelength at which the light intensity is highest (the wavelength is hereinafter referred to as a peak wavelength) with the change in the refractive index of the periodic structure than the photoluminescent layer having a thickness of 400 nm (FIG. 8). This is because the quasi-guided mode is more affected by the refractive index of the periodic structure as the photoluminescent layer is thinner. Specifically, a periodic structure having a higher refractive index increases the effective refractive index and thus shifts the peak wavelength toward longer wavelengths, and this effect is more noticeable as the photoluminescent layer is thinner. The effective refractive index is determined by the refractive index of the medium present in the region where the electric field of the quasi-guided mode is distributed.

The results also show that a periodic structure having a higher refractive index results in a broader peak and lower intensity. This is because a periodic structure having a higher refractive index emits light in the quasi-guided mode at a higher rate and is therefore less effective in confining light, that is, has a lower Q value. To maintain high peak intensity, a structure may be employed in which light is moderately emitted using a quasi-guided mode that is effective in confining light (that is, has a high Q value). This means that it is undesirable to use a periodic structure formed of a material having a much higher refractive index than the photoluminescent layer. Thus, in order to increase the peak intensity and Q value, the refractive index of a dielectric material constituting the periodic structure (that is, the light-transmissive layer) can be lower than or similar to the refractive index of the photoluminescent layer. This is also true if the photoluminescent layer contains materials other than photoluminescent materials.

4-2. Height of Periodic Structure

Figure 10:
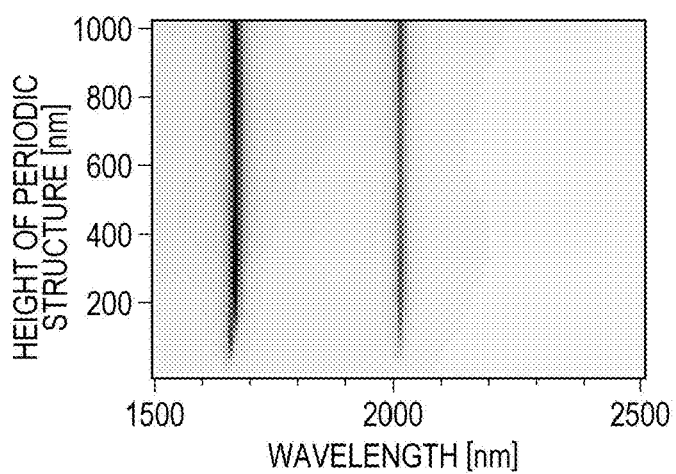
FIG. 10 is a graph showing the calculation results of the enhancement of light emitted in the front direction with varying emission wavelengths and varying heights of the periodic structure.
Figure 11:
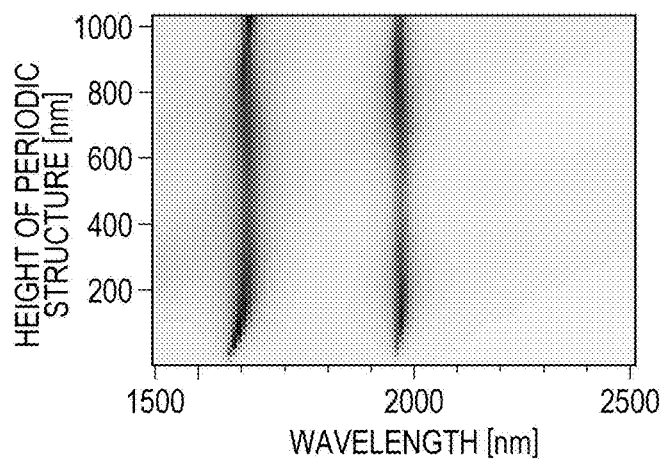
FIG. 11 is a graph showing the results of calculations performed under the same conditions as in FIG. 10 except that the periodic structure has a refractive index $n_p$ of 2.0.

The height of the periodic structure was then studied. In the calculations performed herein, the photoluminescent layer had a thickness of 1000 nm and a refractive index $n_{wav}$ of 1.8, the periodic structure was a one-dimensional periodic structure uniform in the y direction, as illustrated in FIG. 1A, and had a refractive index $n_p$ of 1.5 and a period of 1200 nm, and the polarization of light was in the TM mode, which has an electric field component parallel to the y direction. FIG. 10 shows the calculation results of the enhancement of light emitted in the front direction with varying emission wavelengths and varying heights of the periodic structure. FIG. 11 shows the results of calculations performed under the same conditions except that the periodic structure has a refractive index $n_p$ of 2.0. Whereas the results in FIG. 10 show that the peak intensity and the Q value (that is, the peak line width) do not change when the periodic structure has at least a certain height, the results in FIG. 11 show that the peak intensity and the Q value decrease with increasing height of the periodic structure. If the refractive index $n_{wav}$ of the photoluminescent layer is higher than the refractive index $n_p$ of the periodic structure (FIG. 10), light is totally reflected, and only a leaking (evanescent) portion of the electric field of the quasi-guided mode interacts with the periodic structure. If the periodic structure has a sufficiently large height, the influence of the interaction between the evanescent portion of the electric field and the periodic structure remains constant irrespective of the height. In contrast, if the refractive index $n_{wav}$ of the photoluminescent layer is lower than the refractive index $n_p$ of the periodic structure (FIG. 11), light reaches the surface of the periodic structure without being totally reflected and is therefore more influenced by the periodic structure with a larger height. As shown in FIG. 11, a height of approximately 200 nm is sufficient, and the peak intensity and the Q value decrease above a height of 300 nm. Thus, if the refractive index $n_{wav}$ of the photoluminescent layer is lower than the refractive index $n_p$ of the periodic structure, the periodic structure may have a height of 300 nm or less to achieve a high peak intensity and Q value.

4-3. Polarization Direction

Figure 12:
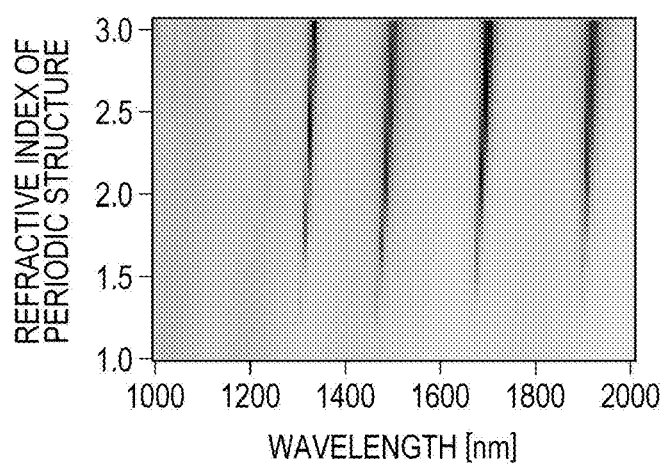
FIG. 12 is a graph showing the results of calculations performed under the same conditions as in FIG. 9 except that the polarization of light is in the TE mode, which has an electric field component perpendicular to the y direction.

The polarization direction was then studied. FIG. 12 shows the results of calculations performed under the same conditions as in FIG. 9 except that the polarization of light was in the TE mode, which has an electric field component perpendicular to the propagation direction. The TE mode is more influenced by the periodic structure than the TM mode because the electric field of the quasi-guided mode leaks more largely in the TE mode than in the TM mode. Thus, the peak intensity and the Q value decrease more significantly in the TE mode than in the TM mode if the refractive index $n_p$ of the periodic structure is higher than the refractive index $n_{wav}$ of the photoluminescent layer.

4-4. Refractive Index of Photoluminescent Layer

Figure 13:
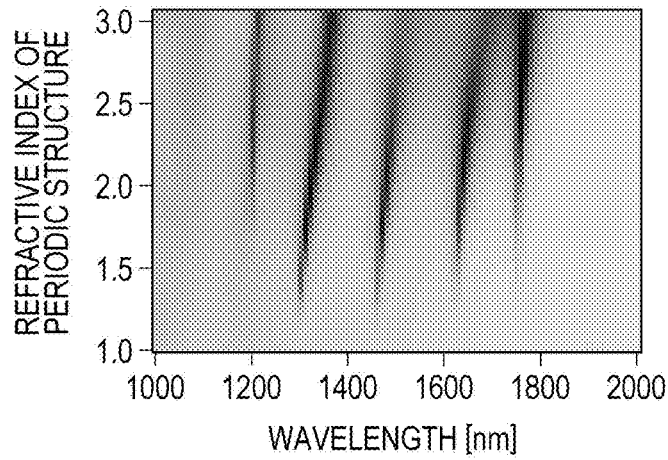
FIG. 13 is a graph showing the results of calculations performed under the same conditions as in FIG. 9 except that the photoluminescent layer has a refractive index $n_{wav}$ of 1.5.

The refractive index of the photoluminescent layer was then studied. FIG. 13 shows the results of calculations performed under the same conditions as in FIG. 9 except that the photoluminescent layer had a refractive index $n_{wav}$ of 1.5. The results for the photoluminescent layer having a refractive index $n_{wav}$ of 1.5 are similar to the results in FIG. 9. However, infrared light having a wavelength of 1800 nm or more was not emitted in the front direction. This is because, from the formula (10), $\lambda_0 < n_{wav} \times p/m = 1.5 \times 1200$ nm/1=1800 nm.

The above analysis demonstrates that a high peak intensity and Q value can be achieved if the periodic structure has a refractive index lower than or similar to the refractive index of the photoluminescent layer or if the periodic structure has a higher refractive index than the photoluminescent layer and a height of 300 nm or less.

5. Modified Examples

Modified examples of the present embodiment will be described below.

5-1. Structure Including Substrate

As described above, the light-emitting device may have a structure in which the photoluminescent layer 110 and the periodic structure 120 are formed on the transparent substrate 140, as illustrated in FIGS. 1C and 1D. Such a light-emitting device 100a may be produced by forming a thin film of the photoluminescent material for the photoluminescent layer 110 (optionally containing a matrix material; the same applies hereinafter) on the transparent substrate 140 and then forming the periodic structure 120 thereon. In this structure, the refractive index $n_s$ of the transparent substrate 140 has to be lower than or equal to the refractive index $n_{wav}$ of the photoluminescent layer 110 so that the photoluminescent layer 110 and the periodic structure 120 function to emit light in a particular direction. If the transparent substrate 140 is provided in contact with the photoluminescent layer 110, the period p has to be set so as to satisfy the formula (15), which is given by replacing the refractive index $n_{out}$ of the output medium in the formula (10) by $n_s$.

Figure 14:
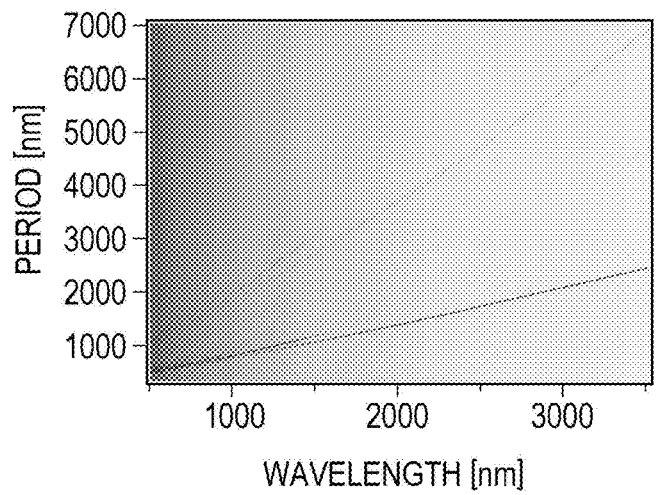
FIG. 14 is a graph showing the results of calculations performed under the same conditions as in FIG. 2 except that the photoluminescent layer and the periodic structure are disposed on a transparent substrate having a refractive index of 1.5.
Figure 15:
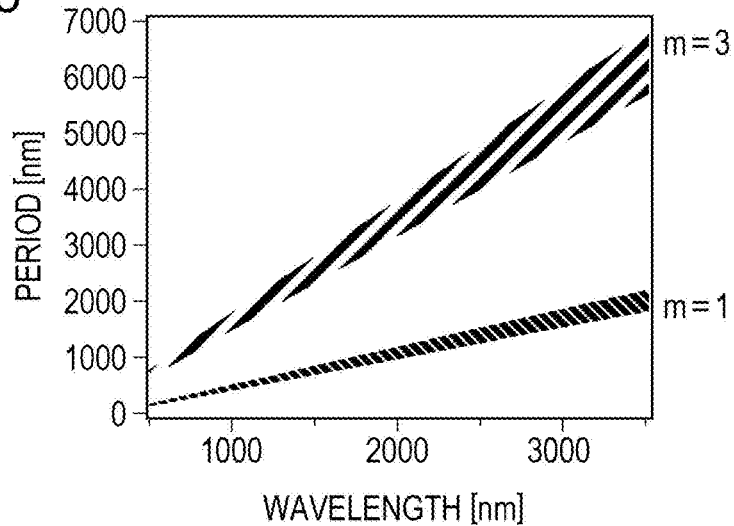
FIG. 15 is a graph illustrating the condition represented by the formula (15)

To demonstrate this, calculations were performed under the same conditions as in FIG. 2 except that the photoluminescent layer 110 and the periodic structure 120 were disposed on a transparent substrate 140 having a refractive index of 1.5. FIG. 14 shows the results of these calculations. As in the results in FIG. 2, light intensity peaks are observed at particular periods for each wavelength, although the ranges of periods where peaks appear differ from those in FIG. 2. FIG. 15 is a graph illustrating the condition represented by the formula (15), which is given by substituting $n_{out}=n_s$ into the formula (10). In FIG. 14, light intensity peaks are observed in the regions corresponding to the ranges shown in FIG. 15.

Thus, for the light-emitting device 100a, in which the photoluminescent layer 110 and the periodic structure 120 are disposed on the transparent substrate 140, a period p that satisfies the formula (15) is effective, and a period p that satisfies the formula (13) is significantly effective.

5-2. Light-Emitting Apparatus Including Excitation Light Source

Figure 16:
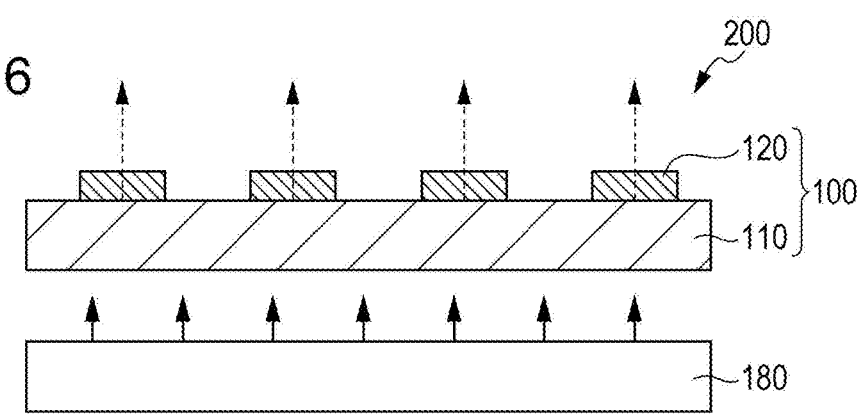
FIG. 16 is a schematic view of a light-emitting apparatus including the light-emitting device illustrated in FIGS. 1A and 1B and a light source that emits excitation light toward a photoluminescent layer.

FIG. 16 is a schematic view of a light-emitting apparatus 200 including the light-emitting device 100 illustrated in FIGS. 1A and 1B and a light source 180 that emits excitation light toward the photoluminescent layer 110. In this embodiment, as described above, the photoluminescent layer can be excited with excitation light, such as ultraviolet light or blue light, and emit directional light. The light-emitting apparatus 200 including the light source 180 that can emit such excitation light can emit directional light. Although the wavelength of excitation light from the light source 180 is typically within the ultraviolet or blue range, it is not necessarily within these ranges, but may be determined depending on the photoluminescent material for the photoluminescent layer 110. Although the light source 180 illustrated in FIG. 16 is configured to direct excitation light into the bottom surface of the photoluminescent layer 110, it may be configured otherwise, for example, to direct excitation light into the top surface of the photoluminescent layer 110.

Figure 17A:
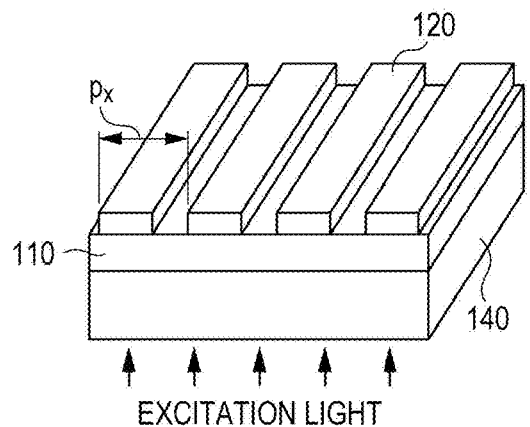
FIG. 17A is an explanatory view of a structure in which excitation light is coupled into a quasi-guided mode to efficiently emit light, illustrating a one-dimensional periodic structure having a period $p_x$ in the x direction.
Figure 17B:
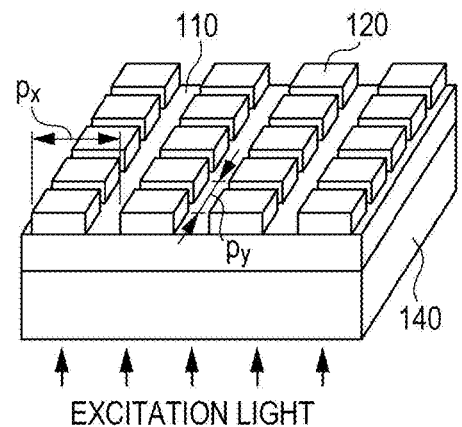
FIG. 17B is an explanatory view of a structure in which excitation light is coupled into a quasi-guided mode to efficiently emit light, illustrating a two-dimensional periodic structure having a period $p_x$ in the x direction and a period $p_y$ in the y direction.

Excitation light may be coupled into a quasi-guided mode to efficiently emit light. FIGS. 17A and 17B illustrate such a method. In this example, as in the structure illustrated in FIGS. 1C and 1D, the photoluminescent layer 110 and the periodic structure 120 are formed on the transparent substrate 140. As illustrated in FIG. 17A, the period $p_x$ in the x direction is first determined so as to enhance light emission. As illustrated in FIG. 17B, the period $p_y$ in the y direction is then determined so as to couple excitation light into a quasi-guided mode. The period $p_x$ is determined so as to satisfy the condition given by replacing p by $p_x$ in the formula (10). The period $p_y$ is determined so as to satisfy the formula (16):

$$\frac{m\lambda_{ex}}{n_{wav}} < p_y < \frac{m\lambda_{ex}}{n_{out}} \quad (16)$$

wherein m is an integer of 1 or more, $\lambda_{ex}$ denotes the wavelength of excitation light, and $n_{out}$ denotes the refractive index of a medium having the highest refractive index of the media in contact with the photoluminescent layer 110 except the periodic structure 120.

In the example in FIGS. 17A and 17B, $n_{out}$ denotes the refractive index $n_s$ of the transparent substrate 140. For a structure including no transparent substrate 140, as illustrated in FIG. 16, $n_{out}$ denotes the refractive index of air (approximately 1.0).

In particular, excitation light can be more effectively converted into a quasi-guided mode if m=1, that is, if the period $p_y$ is determined so as to satisfy the formula (17):

$$\frac{\lambda_{ex}}{n_{wav}} < p_y < \frac{\lambda_{ex}}{n_{out}} \quad (17)$$

Thus, excitation light can be converted into a quasi-guided mode if the period $p_y$ is set so as to satisfy the condition represented by the formula (16) (particularly, the condition represented by the formula (17)). As a result, the photoluminescent layer 110 can efficiently absorb excitation light of the wavelength $\lambda_{ex}$.

Figure 17C:
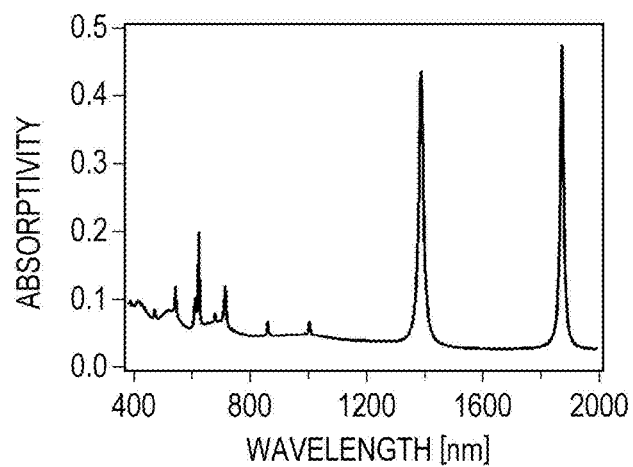
FIG. 17C is a graph showing the wavelength dependence of light absorptivity in the structure illustrated in FIG. 17A.
Figure 17D:
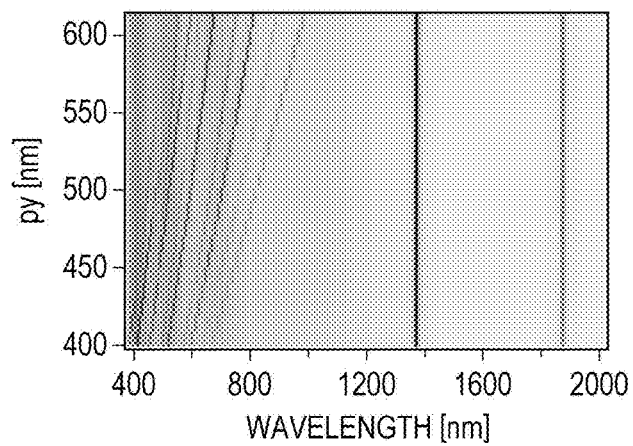
FIG. 17D is a graph showing the dependence of the enhancement of light on the period $p_y$ in the y direction and wavelength.

FIG. 17C is a graph showing the calculation results of the wavelength dependence of light absorptivity in the structure illustrated in FIG. 17A. In the calculation, $p_x$ was 1200 nm, excitation light had a wavelength $\lambda_{ex}$ of approximately 450 nm, and the photoluminescent layer 110 had an extinction coefficient of 0.003. FIG. 17D is a graph showing the dependence of the enhancement of light on the period $p_y$ in the y direction and wavelength in the structure illustrated in FIG. 17B. FIG. 17D shows high absorptivity not only for light from the photoluminescent layer 110 but also for excitation light of approximately 450 nm. This indicates that incident light is effectively converted into a quasi-guided mode and thereby increases the proportion of light absorbed into the photoluminescent layer 110. The photoluminescent layer 110 also has high absorptivity for light of approximately 1400 and 1900 nm. This indicates that near-infrared light having the wavelength incident on this structure is similarly effectively converted into a quasi-guided mode. The periodic structure 120 illustrated in FIG. 17B is a two-dimensional periodic structure including structures having different periods (different periodic components) in the x direction and the y direction. Such a two-dimensional periodic structure including multiple periodic components allows for high excitation efficiency and high output intensity. Although excitation light is incident on the transparent substrate 140 in FIGS. 17A and 17B, the same effect can be achieved even if excitation light is incident on the periodic structure 120.

Also available are two-dimensional periodic structures including periodic components as illustrated in FIGS. 18A and 18B. The structure illustrated in FIG. 18A includes periodically arranged projections or recesses having a hexagonal planar shape. The structure illustrated in FIG. 18B includes periodically arranged projections or recesses having a triangular planar shape. These structures have major axes (axes 1 to 3 in these examples) that can be assumed to be periodic. Thus, the structures can have different periods in different axial directions. These periods may be set so as to increase the directionality of light beams of different wavelengths or to efficiently absorb excitation light. In any case, each period is set so as to satisfy the condition corresponding to the formula (10).

5-3. Periodic Structure on Transparent Substrate

Figure 19A:
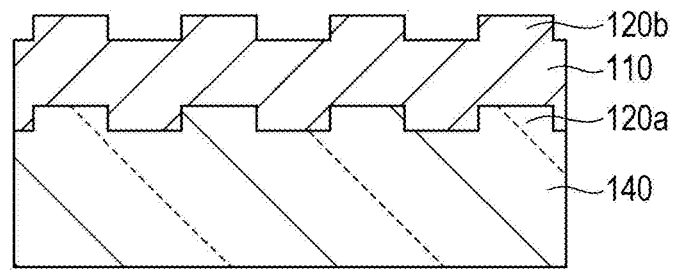
FIG. 19A is a schematic view of a modified example in which a periodic structure is formed on a transparent substrate.
Figure 19B:
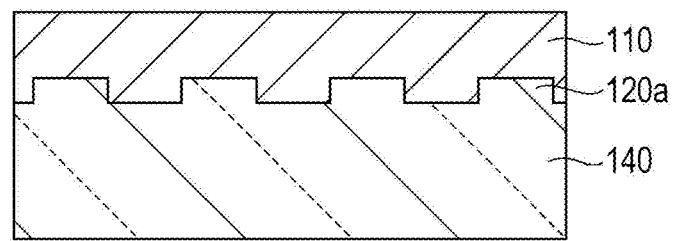
FIG. 19B is a schematic view of another modified example in which a periodic structure is formed on a transparent substrate.
Figure 19C:
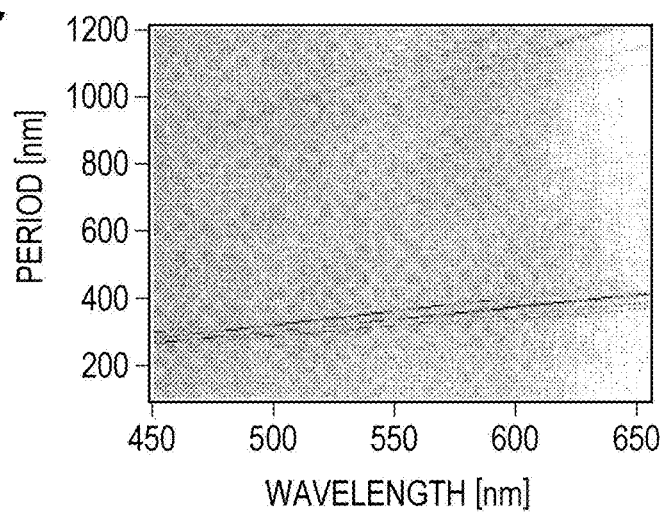
FIG. 19C is a graph showing the calculation results of the enhancement of light emitted from the structure illustrated in FIG. 19A in the front direction with varying emission wavelengths and varying periods of the periodic structure.

As illustrated in FIGS. 19A and 19B, a periodic structure 120a may be formed on the transparent substrate 140, and the photoluminescent layer 110 may be disposed thereon. In the example in FIG. 19A, the photoluminescent layer 110 is formed along the texture of the periodic structure 120a on the transparent substrate 140. As a result, a periodic structure 120b with the same period is formed in the surface of the photoluminescent layer 110. In the example in FIG. 19B, the surface of the photoluminescent layer 110 is flattened. In these examples, directional light emission can be achieved by setting the period p of the periodic structure 120a so as to satisfy the formula (15). To verify the effect of these structures, the enhancement of light emitted from the structure in FIG. 19A in the front direction was calculated with varying emission wavelengths and varying periods of the periodic structure. In these calculations, the photoluminescent layer 110 had a thickness of 1000 nm and a refractive index $n_{wav}$ of 1.8, the periodic structure 120a was a one-dimensional periodic structure uniform in the y direction and had a height of 50 nm, a refractive index $n_p$ of 1.5, and a period of 400 nm, and the polarization of light was in the TM mode, which has an electric field component parallel to the y direction. FIG. 19C shows the results of these calculations. In these calculations, light intensity peaks were observed at the periods that satisfy the condition represented by the formula (15). Although the calculations were performed in the visible wavelength range, a similar degree of agreement could be obtained in the infrared wavelength range.

5-4. Powder

According to these embodiments, light of any wavelength can be enhanced by adjusting the period of the periodic structure and/or the thickness of the photoluminescent layer. For example, if the structure illustrated in FIGS. 1A and 1B is formed using a photoluminescent material that emits light over a wide wavelength range, only light of a certain wavelength can be enhanced. The structure of the light-emitting device 100 as illustrated in FIGS. 1A and 1B may be provided in powder form for use as a fluorescent material. Alternatively, the light-emitting device 100 as illustrated in FIGS. 1A and 1B may be embedded in resin or glass.

Figure 20:
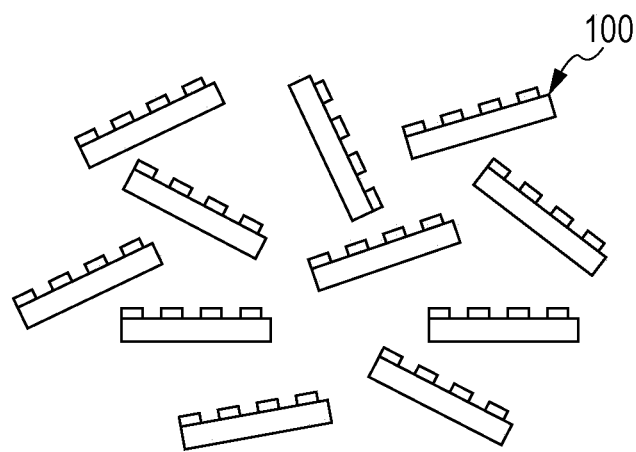
FIG. 20 is a schematic view of a mixture of light-emitting devices in powder form.

The single structure as illustrated in FIGS. 1A and 1B can emit only light of a certain wavelength in a particular direction and is therefore not suitable for light having a wide wavelength spectrum, such as infrared light. As shown in FIG. 20, light-emitting devices 100 that differ in the conditions such as the period of the periodic structure and the thickness of the photoluminescent layer may be mixed to provide a light-emitting apparatus with a wide wavelength spectrum. In such a case, the individual light-emitting devices 100 have sizes of, for example, several micrometers to several millimeters in one direction and can include, for example, one- or two-dimensional periodic structures with several periods to several hundreds of periods.

5-5. Array of Structures with Different Periods

Figure 21:
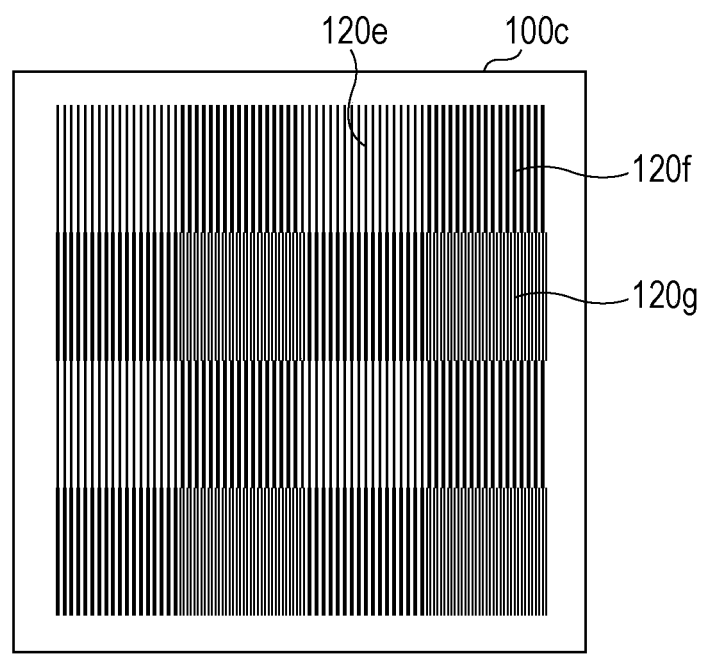
FIG. 21 is a plan view of a two-dimensional array of periodic structures having different periods on a photoluminescent layer.

FIG. 21 is a plan view of a two-dimensional array of periodic structures having different periods on a photoluminescent layer. In this example, a light-emitting device 100c has three types of periodic structures 120e, 120f, and 120g arranged without any space therebetween. The periodic structures 120e, 120f, and 120g have periods that allow infrared light in different wavelength ranges to be emitted in the front direction. Such structures having different periods can be arranged on the photoluminescent layer to emit directional light with a wide wavelength spectrum. The periodic structures are not necessarily formed as described above, but may be formed in any manner.

5-6. Layered Structure

Figure 22:
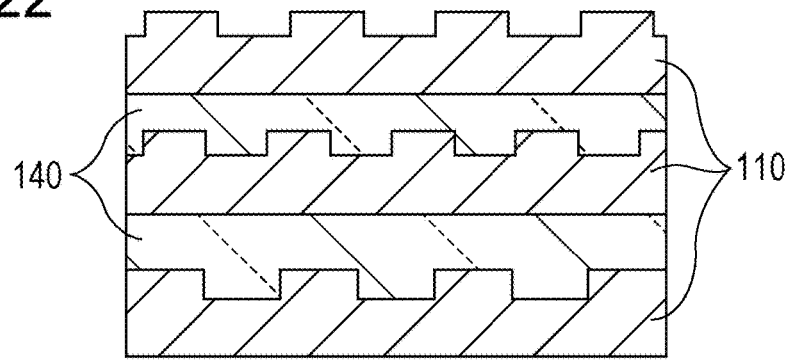
FIG. 22 is a schematic view of a light-emitting device including photoluminescent layers each having a textured surface.

FIG. 22 illustrates a light-emitting device including photoluminescent layers 110 each having a textured surface. A transparent substrate 140 is disposed between the photoluminescent layers 110. The texture on each of the photoluminescent layers 110 corresponds to the periodic structure. The light-emitting device in FIG. 22 includes three periodic structures having different periods. The periodic structures have periods that allow infrared light in different wavelength ranges to be emitted in the front direction. The photoluminescent layer 110 in each layer is formed of a material that can emit infrared light of a wavelength corresponding to the period of the periodic structure in that layer. Thus, periodic structures having different periods can be stacked on top of each other to emit directional light with a wide wavelength spectrum.

The number of layers and the constructions of the photoluminescent layer 110 and the periodic structure in each layer are not limited to those described above, but may be selected as appropriate. For example, for a structure including two layers, first and second photoluminescent layers are formed opposite each other with a light-transmissive substrate therebetween, and first and second periodic structures are formed on the surfaces of the first and second photoluminescent layers, respectively. In such a case, the first photoluminescent layer and the first periodic structure satisfy the condition represented by the formula (15), and the second photoluminescent layer and the second periodic structure satisfy the condition represented by the formula (15). For a structure including three or more layers, the photoluminescent layer and the periodic structure in each layer satisfy the condition represented by the formula (15). The positional relationship between the photoluminescent layers and the periodic structures in FIG. 22 may be reversed. Although the layers have different periods in FIG. 22, all the layers may have the same period. In such a case, although the spectrum cannot be broadened, the emission intensity can be increased.

5-7. Structure Including Protective Layer

Figure 23:
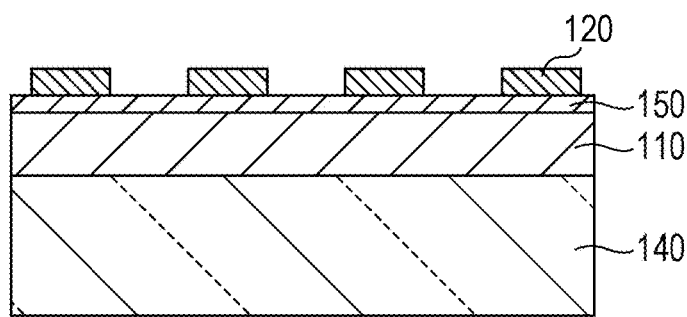
FIG. 23 is a cross-sectional view of a structure including a protective layer between a photoluminescent layer and a periodic structure.

FIG. 23 is a cross-sectional view of a structure including a protective layer 150 between the photoluminescent layer 110 and the periodic structure 120. The protective layer 150 may be provided to protect the photoluminescent layer 110. However, if the protective layer 150 has a lower refractive index than the photoluminescent layer 110, the electric field of light leaks into the protective layer 150 only by about half the wavelength. Thus, if the protective layer 150 is thicker than the wavelength, no light reaches the periodic structure 120. As a result, there is no quasi-guided mode, and the function of emitting light in a particular direction cannot be achieved. If the protective layer 150 has a refractive index higher than or similar to that of the photoluminescent layer 110, light reaches the interior of the protective layer 150; therefore, there is no limitation on the thickness of the protective layer 150. Nevertheless, a thinner protective layer 150 is desirable because more light is emitted if most of the portion in which light is guided (this portion is hereinafter referred to as a "waveguide layer") is formed of a photoluminescent material. The protective layer 150 may be formed of the same material as the periodic structure (light-transmissive layer) 120. In such a case, the light-transmissive layer 120 having the periodic structure functions as a protective layer. The light-transmissive layer 120 desirably has a lower refractive index than the photoluminescent layer 110.

6. Materials

Directional light emission can be achieved if the photoluminescent layer (or waveguide layer) and the periodic structure are formed of materials that satisfy the above conditions. The periodic structure may be formed of any material. However, a photoluminescent layer (or waveguide layer) or a periodic structure formed of a medium with high light absorption is less effective in confining light and therefore results in a lower peak intensity and Q value. Thus, the photoluminescent layer (or waveguide layer) and the periodic structure may be formed of media with relatively low light absorption.

For example, the periodic structure may be formed of a dielectric material having low light absorptivity. Examples of candidate materials for the periodic structure include magnesium fluoride ($MgF_2$), lithium fluoride (LiF), calcium fluoride ($CaF_2$), quartz ($SiO_2$), glasses, resins, magnesium oxide (MgO), indium tin oxide (ITO), titanium oxide ($TiO_2$), silicon nitride (SiN), tantalum pentoxide ($Ta_2O_5$), zirconia ($ZrO_2$), zinc selenide (ZnSe), and zinc sulfide (ZnS). To form a periodic structure having a lower refractive index than the photoluminescent layer, as described above, $MgF_2$, LiF, $CaF_2$, $SiO_2$, glasses, and resins can be used, which have refractive indices of approximately 1.3 to 1.5.

The term "photoluminescent material" encompasses fluorescent materials and phosphorescent materials in a narrow sense, encompasses inorganic materials and organic materials (for example, dyes), and encompasses quantum dots (that is, tiny semiconductor particles). In general, fluorescent materials containing an inorganic host material tend to have a higher refractive index.

Examples of fluorescent materials that emit light in a near-infrared region (wavelength: approximately 750 to 2500 nm) include $CaAlSiN_3:Eu^{2+}$, $SrAlSi_4O_7:Eu^{2+}$, $M_2Si_5N_8:Eu^{2+}$ (wherein M is at least one element selected from Ba, Sr, and Ca), $MSiN_2:Eu^{2+}$ (wherein M is at least one element selected from Ba, Sr, and Ca), $MSi_2O_2N_2:Yb^{2+}$ (wherein M is at least one element selected from Sr and Ca), $Y_2O_2S:Eu^{3+}$, $Sm^{3+}$, $La_2O_2S:Eu^{3+}$, $Sm^{3+}$, $CaWO_4:Li^{1+}$, $Eu^{3+}$, $Sm^{3+}$, $M_2SiS_4:Eu^{2+}$ (wherein M is at least one element selected from Ba, Sr, and Ca), $M_3SiO_5:Eu^{2+}$ (wherein M is at least one element selected from Ba, Sr, and Ca), YAG:Cr, $Zn_3Ga_2Ge_2O_{10}:Cr$, $Lu_3Al_5O_{12}(LuAG):Cr$, $LiAl_5O_8:Cr$, GGG:Cr, $K_2O.Al_2O_3.2SiO_2.xH_2O:Nd,Ce$, $Lu_2O_2S:Nd,Yb$, LaOCl:Nd,Yb, $YVO_4:Nd,Yb$, $Y(PO_3)_3:Nd,Yb$, $CaGa_2S_4:Mn$, $LiAlO_2:Fe$, CaS:Yb,Cl, $CaTiAlO_3:Bi$, $Y_2O_3:Yb,Er$, $Gd_2O_3:Yb,Er$, $Gd_2O_2S:Yb,Er$, and $CaSc_2O_4:Ce^{3+},Nd^{3+}$.

Examples of materials that emit light in a mid-infrared region (wavelength: approximately 2.5 to 4 μm) include glasses and fluorescent substances doped with rare earth ions ($Yb^{3+}$, $Er^{3+}$, $Tm^{3+}$, $Ho^{3+}$, and/or $Dy^{3+}$).

Examples of quantum dots include materials such as CdS, CdSe, core-shell CdSe/ZnS, and alloy CdSSe/ZnS. Light of various wavelengths can be emitted depending on the material. Examples of matrices for quantum dots include glasses and resins.

The transparent substrate 140, as illustrated in, for example, FIGS. 1C and 1D, is formed of a light-transmissive material having a lower refractive index than the photoluminescent layer 110. Examples of such materials include $MgF_2$, LiF, $CaF_2$, $SiO_2$, glasses, and resins.

7. Production Method

Exemplary production methods will be described below.

Figure 24:
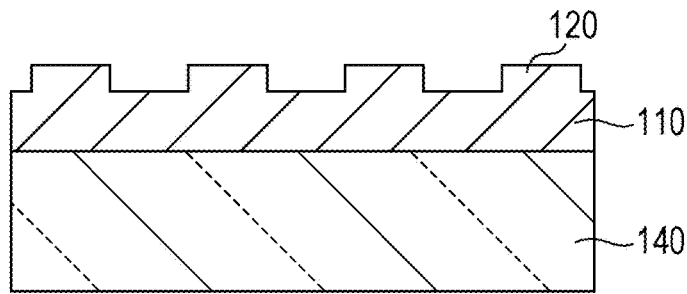
FIG. 24 is a cross-sectional view of a structure including a periodic structure formed by processing only a portion of a photoluminescent layer.

A method for forming the structure illustrated in FIGS. 1C and 1D includes forming a thin film of the photoluminescent layer 110 on the transparent substrate 140, for example, by evaporation, sputtering, or coating of a fluorescent material, forming a dielectric film, and then patterning the dielectric film, for example, by photolithography to form the periodic structure 120. Alternatively, the periodic structure 120 may be formed by nanoimprinting. As illustrated in FIG. 24, the periodic structure 120 may also be formed by partially processing the photoluminescent layer 110. In such a case, the periodic structure 120 is formed of the same material as the photoluminescent layer 110.

The light-emitting device 100 illustrated in FIGS. 1A and 1B can be manufactured, for example, by fabricating the light-emitting device 100a illustrated in FIGS. 1C and 1D and then stripping the photoluminescent layer 110 and the periodic structure 120 from the substrate 140.

The structure illustrated in FIG. 19A can be produced, for example, by forming the periodic structure 120a on the transparent substrate 140 by a process such as a semiconductor process or nanoimprinting and then depositing thereon the material of the photoluminescent layer 110 by a process such as evaporation or sputtering. The structure illustrated in FIG. 19B can be formed by filling the recesses in the periodic structure 120a with the photoluminescent layer 110 by coating.

These production methods are for illustrative purposes only, and the light-emitting devices according to the embodiments of the present disclosure may be produced by other methods.

8. Angular Dependence

Figure 25A:
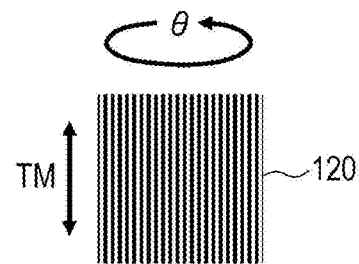
FIG. 25A is a schematic view of a light-emitting device that can emit linearly polarized light in a TM mode, rotated about an axis parallel to the line direction of a one-dimensional periodic structure.
Figure 25B:
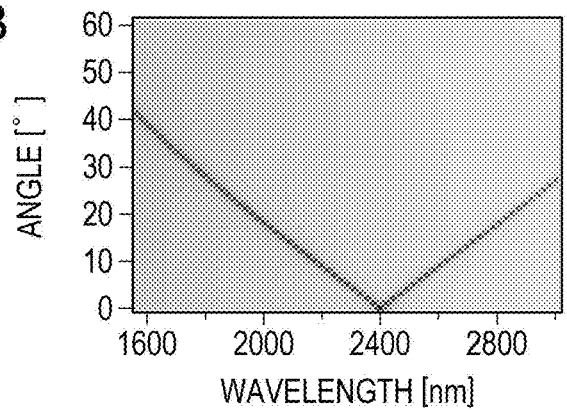
FIG. 25B is a graph showing the calculation results of the angular dependence of light emitted from the light-emitting device rotated as illustrated in FIG. 25A.
Figure 25C:
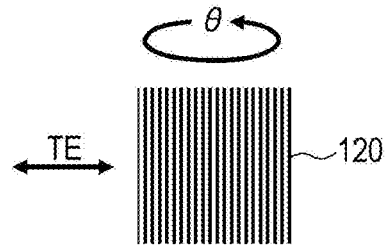
FIG. 25C is a schematic view of a light-emitting device that can emit linearly polarized light in a TE mode, rotated about an axis parallel to the line direction of a one-dimensional periodic structure.
Figure 25D:
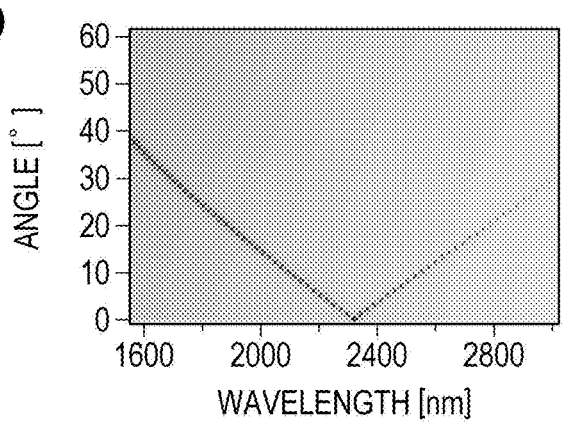
FIG. 25D is a graph showing the calculation results of the angular dependence of light emitted from the light-emitting device rotated as illustrated in FIG. 25C.
Figure 26A:
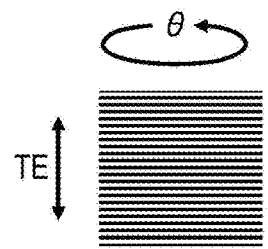
FIG. 26A is a schematic view of a light-emitting device that can emit linearly polarized light in a TE mode, rotated about an axis perpendicular to the line direction of a one-dimensional periodic structure.
Figure 26B:
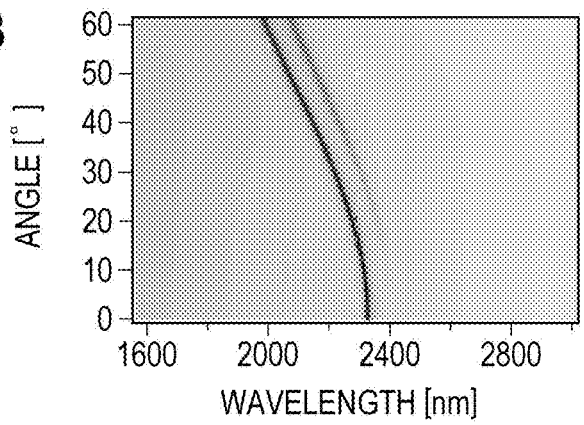
FIG. 26B is a graph showing the calculation results of the angular dependence of light emitted from the light-emitting device rotated as illustrated in FIG. 26A.
Figure 26C:
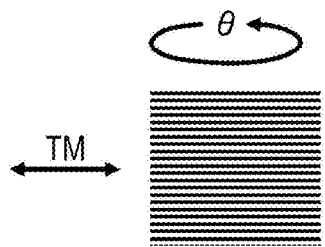
FIG. 26C is a schematic view of a light-emitting device that can emit linearly polarized light in a TM mode, rotated about an axis perpendicular to the line direction of a one-dimensional periodic structure.
Figure 26D:
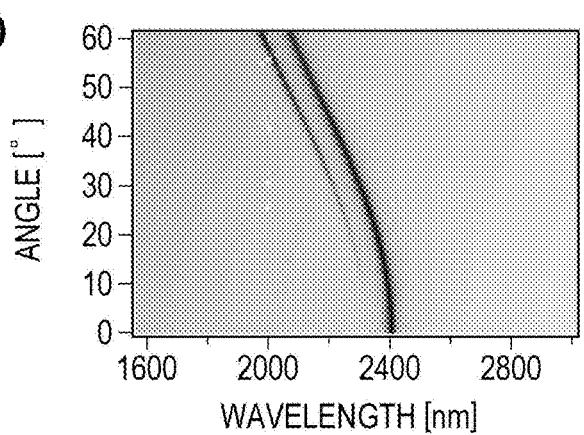
FIG. 26D is a graph showing the calculation results of the angular dependence of light emitted from the light-emitting device rotated as illustrated in FIG. 26C.

FIGS. 25A to 25D and FIGS. 26A to 26D show the calculation results of the angular dependence of light intensity. FIGS. 25B and 25D show the calculation results for rotation about an axis parallel to the line direction of the one-dimensional periodic structure 120. FIGS. 26B and 26D show the calculation results for rotation about an axis perpendicular to the line direction of the one-dimensional periodic structure 120. In FIGS. 25A to 25D and FIGS. 26A to 26D, calculations were performed for linearly polarized light in the TM mode and TE mode. FIGS. 25B and 25D show the calculation results for linearly polarized light in the TM mode and TE mode, respectively. FIGS. 26B and 26D show the calculation results for linearly polarized light in the TE mode and TM mode, respectively. FIGS. 25A to 25D and FIGS. 26A to 26D show that the light enhancement effect is greater in the TM mode, and the wavelength of enhanced light shifts with angle. For example, light of a wavelength of 2400 nm is observed only in the TM mode and in the front direction, indicating that the light is directional and polarized. The directional angle of light emitted in the front direction may be less than 15 degrees. The term "directional angle", as used herein, refers to the angle between the direction in which light has an intensity of 50% of the maximum intensity and the direction in which light has the maximum intensity.

Figure 27:
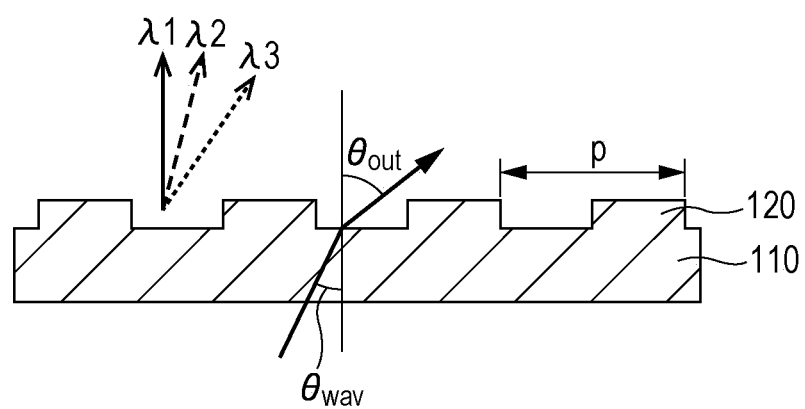
FIG. 27 is a schematic view illustrating the relationship between the wavelength and output direction of light under the emission enhancement effect in a light-emitting device having a periodic structure on a photoluminescent layer.

As described above, the wavelength and output direction of light under the light enhancement effect depend on the periodic structure of a light-emitting device according to the present disclosure. FIG. 27 illustrates a light-emitting device having a periodic structure 120 on a photoluminescent layer 110. The periodic structure 120 is formed of the same material as the photoluminescent layer 110 and is the same as the one-dimensional periodic structure 120 illustrated in FIG. 1A. Light to be enhanced by the one-dimensional periodic structure 120 satisfies $p \times n_{wav} \times \sin\theta_{wav} - p \times n_{out} \times \sin\theta_{out} = m\lambda$ (see the formula (5)), wherein p (nm) denotes the period of the one-dimensional periodic structure 120, $n_{wav}$ denotes the refractive index of the photoluminescent layer 110, $n_{out}$ denotes the refractive index of an outer medium toward which the light is emitted, $\theta_{wav}$ denotes the incident angle on the one-dimensional periodic structure 120, and $\theta_{out}$ denotes the angle at which the light is emitted from one-dimensional periodic structure 120 to the outer medium. $\lambda$ is the light wavelength in air, and m is an integer.

The formula can be transformed into $\theta_{out} = \arcsin[(n_{wav} \times \sin\theta_{wav} - m\lambda/p)/n_{out}]$. Thus, in general, the output angle $\theta_{out}$ of light under the light enhancement effect varies with the wavelength $\lambda$. Consequently, as illustrated in FIG. 27, the wavelength depends on the observation direction.

This angular dependence can be reduced by determining $n_{wav}$ and $n_{out}$ so as to make $(n_{wav} \times \sin\theta_{wav} - m\lambda/p)/n_{out}$ constant for any wavelength $\lambda$. The refractive indices of substances have wavelength dispersion (wavelength dependence). Thus, a material to be selected should have the wavelength dispersion characteristics of $n_{wav}$ and $n_{out}$ such that $(n_{wav} \times \sin\theta_{wav} - m\lambda/p)/n_{out}$ is independent of the wavelength $\lambda$. For example, if the outer medium is air, $n_{out}$ is approximately 1.0 irrespective of the wavelength. Thus, it is desirable that the material of the photoluminescent layer 110 and the one-dimensional periodic structure 120 be a material having narrow wavelength dispersion of the refractive index $n_{wav}$. It is also desirable that the material have reciprocal dispersion, and the refractive index $n_{wav}$ decrease with decreasing wavelength of light.

Figure 28A:
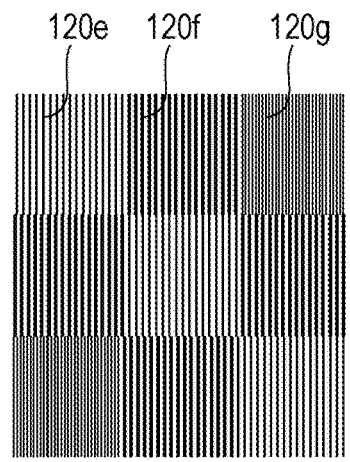
FIG. 28A is a schematic plan view of a structure of an array of periodic structures having different wavelengths at which the light enhancement effect is produced.

As illustrated in FIG. 28A, an array of periodic structures having different wavelengths at which the light enhancement effect is produced can emit infrared light in multiple wavelength ranges The embodiment illustrated in FIG. 28A includes a matrix of periodic structures 120e, 120f, and 120g, which can enhance infrared light in a first wavelength range, a second wavelength range, and a third wavelength range, respectively. Each of the periodic structures 120e, 120f, and 120g may be a one-dimensional periodic structure in which the projections are arranged in parallel. Thus, infrared light beams in the first to third wavelength ranges have the same polarization characteristics. The periodic structures 120e, 120f, and 120g emit enhanced linearly polarized light having three wavelengths in the infrared region.

Each of periodic structures arranged in a matrix is referred to as a unit periodic structure (or pixel). The size (the length of one side) of the unit periodic structure may be at least three times the period. Although each of the unit periodic structures is square in the figure, the periodic structures may be in the shape other than square, such as rectangular, triangular, or hexagonal.

The periodic structures 120e, 120f, and 120g may be disposed on a common photoluminescent layer or on their respective photoluminescent layers containing different photoluminescent materials depending on their wavelengths.

Figure 28B:
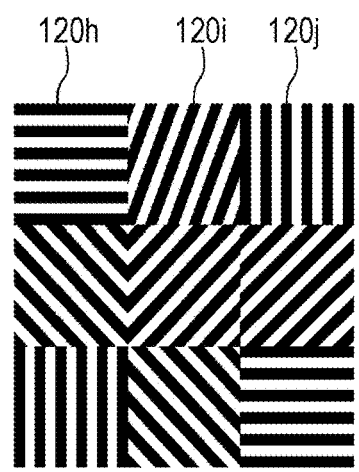
FIG. 28B is a schematic plan view of another structure of an array of periodic structures having different wavelengths at which the light enhancement effect is produced.

As illustrated in FIG. 28B, one-dimensional periodic structures may be arranged such that the longitudinal direction of the projections or recesses in one periodic structure is different from the longitudinal direction of the projections or recesses in another periodic structure. In FIG. 28B, periodic structures including periodic structures 120h, 120i, and 120j are arranged in a matrix. Enhanced light from each of the periodic structures may have the same wavelength or different wavelengths. Such periodic structures arranged in different directions as illustrated in FIG. 28B can emit unpolarized light. If the periodic structures 120e, 120f, and 120g in FIG. 28A are arranged in different directions as illustrated in FIG. 28B, unpolarized infrared light in a wide wavelength range can be emitted as a whole.

Figure 28C:
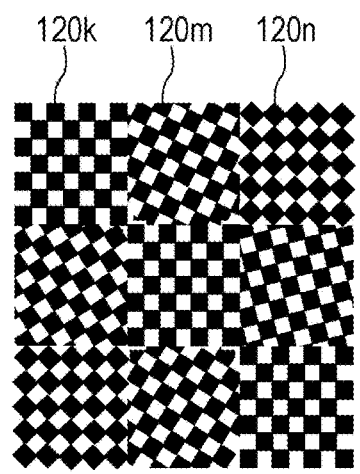
FIG. 28C is a schematic plan view of a still another structure of an array of periodic structures having different wavelengths at which the light enhancement effect is produced.

As described above, the periodic structures are not limited to one-dimensional periodic structure and may be two-dimensional periodic structures as illustrated in FIG. 28C. The two-dimensional periodic structures in FIG. 28C include periodic structures 120k, 120m, and 120n. The period and direction of each of the periodic structures 120k, 120m, and 120n may be the same or different, as described above, and are appropriately determined as required.

Figure 29:
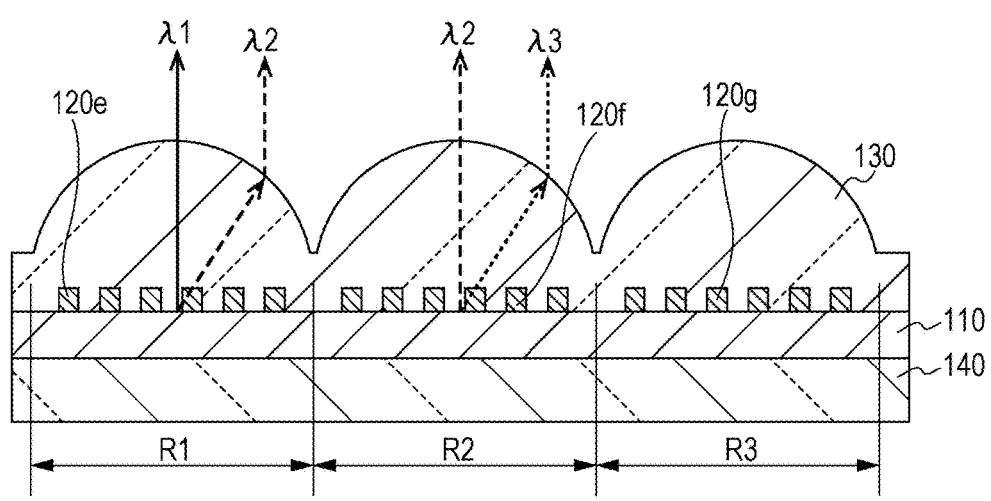
FIG. 29 is a schematic cross-sectional view of a light-emitting device including microlenses.

FIG. 29 is a fragmentary cross-sectional view of a light-emitting device according to another embodiment. As illustrated in FIG. 29, microlenses 130 may be disposed on a light output side of a light-emitting device. The microlenses 130 can refract oblique infrared light in the normal direction and output infrared light having multiple wavelengths in a particular direction (for example, in the front direction).

The light-emitting device in FIG. 29 includes regions R1, R2, and R3. The regions R1, R2, and R3 have the periodic structures 120e, 120f, and 120g illustrated in FIG. 28A, respectively. In the region R1, the periodic structure 120e outputs infrared light of a wavelength $\lambda 1$ in the normal direction and outputs infrared light of a wavelength $\lambda 2$ in an oblique direction. The microlenses 130 refract the infrared light of the wavelength $\lambda 2$ from the oblique direction to the normal direction. Consequently, the infrared light of the wavelength $\lambda 1$ and the infrared light of the wavelength $\lambda 2$ are simultaneously observed in the normal direction. Likewise, in the region R2, the periodic structure 120f outputs infrared light of a wavelength $\lambda 2$ in the normal direction and outputs infrared light of a wavelength $\lambda 3$ in an oblique direction. The microlenses 130 refract the infrared light of the wavelength $\lambda 3$ from the oblique direction to the normal direction. Consequently, the infrared light of the wavelength $\lambda 2$ and the infrared light of the wavelength $\lambda 3$ are simultaneously observed in the normal direction. Thus, the microlenses 130 can reduce the difference in light wavelength depending on the angle. Although the microlens array including the microlenses 130 corresponding to the periodic structures is described here, another microlens array is also possible. As a matter of course, periodic structures to be tiled are not limited to those described above and may be the same periodic structures or the structures illustrated in FIG. 28B or 28C.

Optical elements for refracting oblique light are not limited to microlens arrays and may also be lenticular lenses. In addition to lenses, prisms may also be used. A prism array may also be used. A prism corresponding to each periodic structure may be arranged. Prisms of any shape may be used. For example, triangular prisms or pyramidal prisms may be used.

9. Application Examples

As described above, light-emitting devices and light-emitting apparatuses including the light-emitting devices according to the present disclosure have various advantages and can be used with advantageous effects in various optical devices. Some application examples will be described below.

A light-emitting device according to the present disclosure can emit directional infrared light in a particular direction. This high directionality can be applied to observation of body tissues, examination of the composition of substances, such as foods and chemicals, biometric authentication, and infrared communication, for example. A directional light emitting device according to the present disclosure can irradiate only the target with infrared light. A directional light emitting device according to the present disclosure can improve imaging sensitivity due to enhanced infrared light of a particular wavelength.

Figure 31:
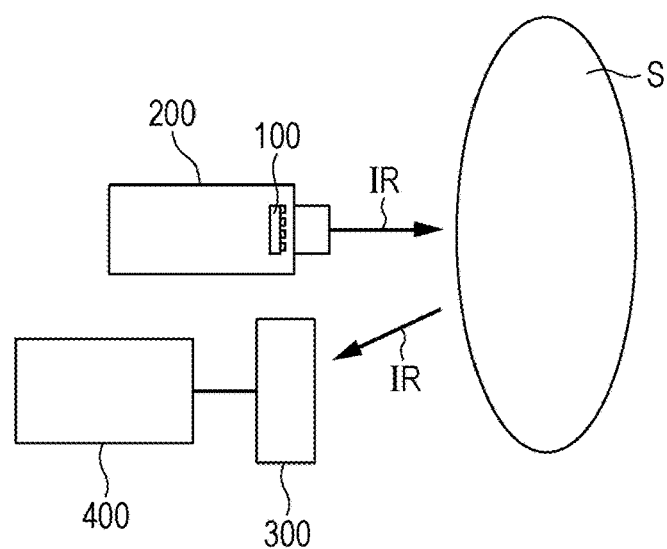
FIG. 31 is a schematic view of an infrared imaging system.

FIG. 31 is a schematic view of a system for such infrared imaging. This system includes a light-emitting apparatus 200, a sensor 300, and a processing apparatus 400. The light-emitting apparatus 200 has the structure of any of the embodiments described above. Infrared light IR of a predetermined wavelength is output through the at least one periodic structure. The sensor 300 is an image sensor sensitive to infrared light in a wavelength range including the infrared light IR. The sensor 300 receives infrared light IR scattered or reflected by a specimen S and outputs electric signals or image signals. The processing apparatus 400 includes a processing circuit (or processor) for processing electric signals or image signals output from the sensor 300. When the light-emitting apparatus 200 emits infrared rays toward the specimen S, the specimen S absorbs the light due to its internal physical properties. The sensor 300 receives scattered or reflected infrared light, which is not absorbed. The intensity of infrared light received by the sensor 300 varies with the position, which depends on the composition or physical properties of the specimen S. Thus, the composition and state of the specimen S can be determined on the basis of electric signals or image information output from the sensor 300. Although the sensor 300 detects scattered light or reflected light from the specimen S in this example, the sensor 300 may detect transmitted light in some applications.

Such a system can be used to observe body tissues in the human brain, for example. Near-infrared rays having a wavelength in the range of 700 to 1400 nm can be used for observation of body tissues. Hemoglobin in the living body absorbs light of 700 nm or less, and water absorbs near-infrared rays of 1400 nm or more. Near-infrared rays in the range of 700 to 1400 nm are less absorbed. Thus, light in this wavelength range enters the interior of the living body, and scattered light can be observed. This can provide information about the interior of the living body, such as the brain.

Such a system can also be utilized for biometric authentication. For example, the light-emitting apparatus 200 illustrated in FIG. 31 can be used to irradiate the palm of the hand with near-infrared rays, and reflected light and scattered light can be detected with the sensor 300 to determine the position of veins on the palm of the hand. This is because hemoglobin (reduced hemoglobin) in the veins easily absorbs near-infrared rays. Images obtained by the sensor 300 have low brightness at the positions of veins and high brightness at the other positions. Individuals can be identified on the basis of the vein distribution obtained from images.

Such a system can be suitably utilized for the component analysis of foods. Water, proteins, and fats in foods absorb near-infrared rays in different absorption wavelength ranges. For example, the absorption wavelength range of proteins ranges from approximately 1.3 to 1.7 µm, the absorption wavelength range of water ranges from approximately 1.4 to 2 µm, and the absorption wavelength range of fats ranges from approximately 2.2 to 2.5 µm. Thus, the component analysis and inspection of foods can be performed by taking images using infrared rays in a wavelength range depending on the component of the target. Likewise, the component analysis of chemicals, detection of foreign matter in products, and automatic inspection for uneven compounding in products can be performed.

Figure 32:
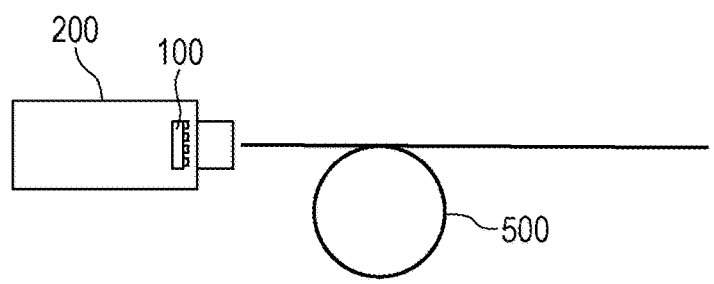
FIG. 32 is a schematic view of a system including a light-emitting apparatus in combination with an optical fiber.

A light-emitting apparatus according to the present disclosure can also be utilized for infrared communication. In this case, the light-emitting apparatus can be used as an infrared light source for optical fibers. FIG. 32 is a schematic view of a system including a light-emitting apparatus 200 in combination with an optical fiber 500. A light-emitting device 100 of the light-emitting apparatus 200 may be designed to emit near-infrared light in the wavelength range of 1260 to 1625 nm (O-Band) or 1460 to 1530 nm (S-Band). Such near-infrared light can be utilized for communication through the optical fiber 500.

Light-emitting devices and light-emitting apparatuses according to the present disclosure can be utilized in imaging systems for high sensitive imaging even in the sunlight. The sunlight includes light in a wavelength range of approximately 300 nm to 3 µm (near-ultraviolet rays to mid-infrared rays). The sunlight is partly absorbed by gases, such as ozone in the upper atmosphere, and water, carbon dioxide, and oxygen in the air. Consequently, light of some wavelengths does not reach the surface of the earth. For example, most of the near-infrared rays in the wavelength ranges of 1.3 to 1.5 µm and 1.8 to 2.0 µm do not reach the surface of the earth. Thus, a light-emitting device designed to emit near-infrared rays in these wavelength ranges and an image sensor sensitive to the wavelength ranges can be used to take images with high sensitivity even in the daytime without saturation.

As described above with reference to FIGS. 8 and 9, a change in the refractive index of a periodic structure of a light-emitting device according to the present disclosure results in a different wavelength and output direction of enhanced light. The wavelength and output direction of enhanced light also change with the refractive index of a photoluminescent layer. Thus, a change in the refractive index of a medium around the light-emitting device can be easily detected with high sensitivity. For example, a sensor for detecting various substances can be produced as described below.

First, a substance (such as an enzyme) that selectively binds to a substance to be measured (such as a protein, odorant molecule, or virus) is placed near a periodic structure of a light-emitting device according to the present disclosure. Bonding to the substance to be measured changes the refractive index of a medium around the light-emitting device. The change in the refractive index can be detected as a change in the wavelength or output direction of enhanced light, as described above. Thus, the presence of various substances can be detected.

As described above, a light-emitting device according to the present disclosure can enhance light having a particular wavelength alone. Thus, a light source that emits light having a required wavelength alone can be easily provided. The wavelength of output light can be adjusted only by changing the periodic structure without changing the material of the photoluminescent layer. The wavelength of output infrared light can be changed with the angle relative to the periodic structure. Thus, a light-emitting device according to the present disclosure can be used in various applications that utilize infrared light.

Application examples of a light-emitting device according to the present disclosure are not limited to those described above. A light-emitting device according to the present disclosure can be applied to various optical devices.

Light-emitting devices and light-emitting apparatuses according to the present disclosure can be used in various applications, such as observation of the interior of the living body, examination of the composition of substances, such as foods and chemicals, biometric authentication, and infrared communication.

What is claimed is:

1. A light-emitting device comprising:
a photoluminescent layer that has a first surface perpendicular to a thickness direction thereof and emits light including first light in an infrared region, an area of the first surface being larger than a sectional area of the photoluminescent layer perpendicular to the first surface, the first light having a wavelength $\lambda_a$ in air; and
a light-transmissive layer located on the photoluminescent layer,
wherein at least one of the photoluminescent layer and the light-transmissive layer has a periodic structure having projections or recesses or both arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the periodic structure satisfy $\lambda_a/n_{wav-a} < p_a < \lambda_a$, and
a thickness of the photoluminescent layer, the refractive index $n_{wav-a}$ and the period $p_a$ are set to limit a directional angle of the first light emitted from the light emitting surface.

2. The light-emitting device according to claim 1, wherein a refractive index $n_{t-a}$ of the light-transmissive layer for the first light is lower than a refractive index $n_{wav-a}$ of the photoluminescent layer for the first light.

3. The light-emitting device according to claim 1, wherein the first light has maximum intensity in a first direction predetermined by the periodic structure.

4. The light-emitting device according to claim 3, wherein the directional angle is limited less than 15 degrees with respect to the first direction.

5. A light-emitting device comprising:
a photoluminescent layer that has a first surface perpendicular to a thickness direction thereof and emits light including first light in an infrared region, an area of the first surface being larger than a sectional area of the photoluminescent layer perpendicular to the first surface; and
a light-transmissive layer located on the photoluminescent layer,
wherein the photoluminescent layer contains a photoluminescent material that is excited by a excitation light having a wavelength $\lambda_{ex}$ in air,
at least one of the photoluminescent layer and the light-transmissive layer has a periodic structure having projections or recesses or both arranged perpendicular to the thickness direction of the photoluminescent layer,
at least one of the photoluminescent layer and the light-transmissive layer has a light emitting surface perpendicular to the thickness direction of the photoluminescent layer, the first light and the excitation light being emitted from the light emitting surface,
a refractive index $n_{wav-ex}$ of the photoluminescent layer for the excitation light, and a period $p_{ex}$ of the periodic structure satisfy $\lambda_{ex}/n_{wav-ex} < p_{ex} < \lambda_{ex}$, and
a thickness of the photoluminescent layer, the refractive index $n_{wav-ex}$ and the period $p_{ex}$ are set to limit a directional angle of the excitation light emitted from the light emitting surface.

6. A light-emitting device comprising:
a light-transmissive layer having a periodic structure; and
a photoluminescent layer that has a first surface perpendicular to a thickness direction thereof, is located on the periodic structure and emits light including first light in an infrared region, an area of the first surface being larger than a sectional area of the photoluminescent layer perpendicular to the first surface, the first light having a wavelength $\lambda_a$ in air,
wherein the periodic structure has projections or recesses or both arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the periodic structure satisfy $\lambda_a/n_{wav-a} < p_a < \lambda_a$, and
a thickness of the photoluminescent layer, the refractive index $n_{wav-a}$ and the period $p_a$ are set to limit a directional angle of the first light emitted from the light emitting surface.

7. A light-emitting device comprising:
a photoluminescent layer that has a first surface perpendicular to a thickness direction thereof and emits light including first light in an infrared region, an area of the first surface being larger than a sectional area of the photoluminescent layer perpendicular to the first surface, the first light having a wavelength $\lambda_a$ in air; and
a light-transmissive layer having a higher refractive index than the photoluminescent layer,
wherein the light-transmissive layer has a periodic structure having projections or recesses or both arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the periodic structure satisfy $\lambda_a/n_{wav-a} < p_a < \lambda_a$, and
a thickness of the photoluminescent layer, the refractive index $n_{wav-a}$ and the period $p_a$ are set to limit a directional angle of the first light emitted from the light emitting surface.

8. The light-emitting device according to claim 1, wherein the photoluminescent layer is in contact with the light-transmissive layer.

9. The light-emitting device according to claim 5, wherein the photoluminescent layer is in contact with the light-transmissive layer.

10. The light-emitting device according to claim 6, wherein the photoluminescent layer is in contact with the light-transmissive layer.

11. The light-emitting device according to claim 7, wherein the photoluminescent layer is in contact with the light-transmissive layer.

12. A light-emitting device comprising:
a photoluminescent layer that has a first surface perpendicular to a thickness direction thereof and emits light including first light in an infrared region, an area of the first surface being larger than a sectional area of the photoluminescent layer perpendicular to the first surface, the first light having a wavelength $\lambda_a$ in air, wherein
the photoluminescent layer has a periodic structure having projections or recesses or both arranged perpendicular to the thickness direction of the photoluminescent layer,
at least one of the photoluminescent layer and the light-transmissive layer has a light emitting surface perpendicular to the thickness direction of the photoluminescent layer, the first light being emitted from the light emitting surface,
a refractive index $n_{wav-a}$ of the photoluminescent layer for the first light and a period $p_a$ of the periodic structure satisfy $\lambda_a/n_{wav-a} < p_a < \lambda_a$, and
a thickness of the photoluminescent layer, the refractive index $n_{wav-a}$ and the period $p_a$ are set to limit a directional angle of the first light emitted from the light emitting surface.

13. The light-emitting device according to claim 1, wherein the photoluminescent layer includes a phosphor.

14. The light-emitting device according to claim 1, wherein 0.75 µm≤$\Delta_a$≤4 µm is satisfied.

15. The light-emitting device according to claim 1, wherein the thickness of the photoluminescent layer, the refractive index $n_{wav-a}$ and the period $p_a$ are set to allow an electric field to be formed in the photoluminescent layer, in which antinodes of the electric field are located in or directly below the projections or recesses or both.

16. The light-emitting device according to claim 1, wherein the light-transmissive layer is located indirectly on the photoluminescent layer.

17. The light-emitting device according to claim 1, further comprising a substrate that has refractive index $n_{s-a}$ for the first light and is located on the photoluminescent layer, wherein $\lambda_a/n_{wav-a} < p_a < \lambda_a/n_{s-a}$ is satisfied.

* * * * *